(12) United States Patent
Kim et al.

(10) Patent No.: US 11,829,244 B2
(45) Date of Patent: Nov. 28, 2023

(54) APPARATUS AND METHOD FOR PROGRAMMING DATA IN A MEMORY DEVICE

(71) Applicant: SK hynix Inc., Gyeonggi-do (KR)

(72) Inventors: Sung Hun Kim, Gyeonggi-do (KR); Beom Ju Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 56 days.

(21) Appl. No.: 17/682,602

(22) Filed: Feb. 28, 2022

(65) Prior Publication Data

US 2023/0126507 A1 Apr. 27, 2023

(30) Foreign Application Priority Data

Oct. 21, 2021 (KR) .......................... 10-2021-0140702

(51) Int. Cl.
| | |
|---|---|
| *G06F 11/10* | (2006.01) |
| *G06F 11/07* | (2006.01) |
| *G06F 11/14* | (2006.01) |
| *G11C 16/26* | (2006.01) |
| *G06F 1/30* | (2006.01) |
| *G11C 16/10* | (2006.01) |

(52) U.S. Cl.
CPC ............ *G06F 11/1068* (2013.01); *G06F 1/30* (2013.01); *G06F 11/0772* (2013.01); *G06F 11/1451* (2013.01); *G06F 11/1469* (2013.01); *G11C 16/102* (2013.01); *G11C 16/26* (2013.01)

(58) Field of Classification Search
CPC .... G06F 11/1068; G06F 1/30; G06F 11/0772; G06F 11/1451; G06F 11/1469; G11C 16/102; G11C 16/26
See application file for complete search history.

(56) References Cited

U.S. PATENT DOCUMENTS

| | | | |
|---|---|---|---|
| 6,208,343 B1 * | 3/2001 | Roth | G06F 3/04855 |
| | | | 345/163 |
| 9,858,142 B2 * | 1/2018 | Park | G11C 11/406 |
| 10,860,421 B2 | 12/2020 | Kim | |
| 2014/0281174 A1 | 9/2014 | Lee | |

(Continued)

OTHER PUBLICATIONS

Jaeil Lee et al., Adaptive Paired Page Prebackup Scheme for MLC NAND Flash Memory, IEEE Transactions on Computer-Aided Design of Intergrated Circuits and Systems, Jul. 2014, p. 1110-1114, vol. 33, No. 7, IEEE.

*Primary Examiner* — Guy J Lamarre

(74) *Attorney, Agent, or Firm* — IP & T GROUP LLP

(57) ABSTRACT

A memory device includes a first memory group including plural first non-volatile memory cells capable of storing multi-bit data, and a second memory group including plural second non-volatile memory cells capable of storing single-bit data. A program operation controller builds the multi-bit data based on data inputted from an external device, performs a logical operation regarding partial data among the multi-bit data to generate a parity, programs the parity in the second memory group after programming the partial data in the first memory group, perform a verification operation regarding the partial data after a sudden power-off (SPO) occurs, recovers the partial data based on the parity and a result of the verification operation, and programs recovered partial data in the first memory group.

20 Claims, 22 Drawing Sheets

(56) References Cited

U.S. PATENT DOCUMENTS

2014/0372384 A1* 12/2014 Long .................. G06F 16/10
                                                 707/679
2015/0193299 A1   7/2015 Hyun et al.
2019/0213075 A1* 7/2019 Kim ................ G06F 11/1076
2019/0354288 A1* 11/2019 Jun .................... G11C 16/30

* cited by examiner

APPARATUS AND METHOD FOR PROGRAMMING DATA IN A MEMORY DEVICE

CROSS-REFERENCE TO RELATED APPLICATIONS

This patent application claims the benefit of Korean Patent Application No. 10-2021-0140702, filed on Oct. 21, 2021, the entire disclosure of which is incorporated herein by reference.

TECHNICAL FIELD

One or more embodiments of the present disclosure described herein relate to a memory device, a memory system, and an operation method thereof, and more particularly, to an apparatus and a method for programming data in a non-volatile memory device.

BACKGROUND

A data processing system includes a memory system or a data storage device. The data processing system can be developed to store more voluminous data in the data storage device, store data in the data storage device faster, and read data stored in the data storage device faster. The memory system or the data storage device can include non-volatile memory cells and/or volatile memory cells for storing data.

BRIEF DESCRIPTION OF THE DRAWINGS

The description herein makes reference to the accompanying drawings wherein like reference numerals refer to like parts throughout the figures.

DETAILED DESCRIPTION

Figure 1:
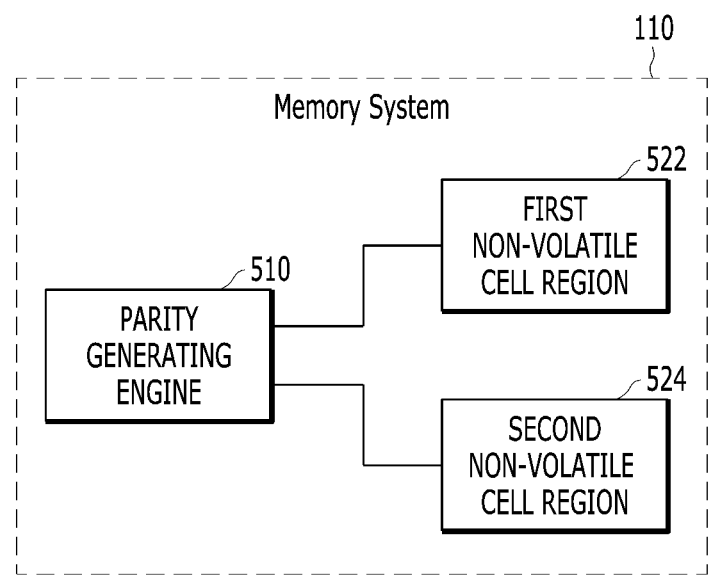
FIG. 1 illustrates an embodiment of a memory system according to an embodiment of the present disclosure.

Various embodiments of the present disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components, e.g., an interface unit, circuitry, etc.

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational, e.g., is not turned on nor activated. The block/unit/circuit/component used with the "configured to" language include hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or portion of a processor and its (or their) accompanying software and/or firmware. The term "circuitry" or "logic" also covers, for example, and if applicable to a particular claim element, an integrated circuit for a storage device.

As used herein, these terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

Embodiments described herein provide an apparatus and a method for improving a data input/output operation of a memory system or a data processing system.

An embodiment of the disclosure may provide a memory system, a data processing system, and an operation process or a method, which may quickly and reliably process data into a memory device by reducing operational complexity and performance degradation of the memory system, thereby enhancing usage efficiency of the memory device.

In an embodiment, a memory device can include a first memory group including plural first non-volatile memory cells capable of storing multi-bit data; a second memory group including plural second non-volatile memory cells capable of storing single-bit data; and a program operation controller configured to build the multi-bit data based on data inputted from an external device, perform a logical operation regarding partial data among the multi-bit data to generate a parity, program the parity in the second memory group after programming the partial data in the first memory group, perform a verification operation regarding the partial data after a sudden power-off (SPO) occurs, recover the partial data based on the parity and a result of the verification operation, and program recovered partial data in the first memory group.

The program operation controller can be further configured to output a completion notice associated with the programming of the partial data after the partial data has been successively programmed in the first memory group.

The program operation controller can program the parity in the second memory group after the outputting of the completion notice.

The partial data can include least significant bit (LSB) data among the multi-bit data. The logical operation can include an exclusive OR (XOR) operation performed while the program operation controller programs the multi-bit data into the first memory group through a multi-step program operation corresponding to a bit number of the multi-bit data.

The program operation controller is further configured to program the multi-bit data into the first memory group through a binary program operation and a foggy-fine program operation. The partial data can include data programmed in a binary program operation.

The program operation controller can recover the partial data based on programmed values, which correspond to the partial data in the first memory group and the parity in the second memory group, during the verification operation performed after power is resumed.

The program operation can include an operation for determining whether the multi-bit data has been successively programmed based on a result of a verification operation after the recovered partial data is programmed in the first memory group.

The program operation controller can be further configured to determine a backup range based on an attribute of the multi-bit data, before the performing of the logical operation.

The program operation controller can is further configured to perform a recovery operation for an error in the partial data stored in the first memory group and back up the partial data among the multi-bit data in the second memory group during the recovery operation.

The first memory group and the second memory group can be included in different memory blocks of a single memory die.

The program operation controller can be included in the memory die.

The program operation controller can be coupled via a data channel to a memory die including the first memory group and the second memory group.

The memory device further includes a cache buffer temporarily storing the partial data; and plural page buffers coupled to the first memory group and the second memory group to store the partial data transferred from the cache buffer.

The program operation controller can include a parity generation engine configured to generate the parity based on the partial data transferred from the cache buffer to the plural page buffers.

In another embodiment, a memory system can include at least one memory die including a first memory group including plural first non-volatile memory cells capable of storing multi-bit data and a second memory group including plural second non-volatile memory cells capable of storing single-bit data; and at least one program operation controller configured to build the multi-bit data based on write data inputted from an external device, perform a logical operation regarding partial data among the multi-bit data to generate a parity, program the parity in the second memory group after programming the partial data in the first memory group, perform a verification operation regarding the partial data after a sudden power-off (SPO) occurs, recover the partial data based on the parity and a result of the verification operation, and program recovered partial data in the first memory group.

The memory system can further include a controller coupled via a data channel to the at least one memory die and configured to receive the write data from the external device and determine a location for storing the multi-bit data in the first memory group.

The controller can be further configured to determine a backup range based on an attribute of the multi-bit data.

The at least one program operation controller can be included in the controller.

The at least one program operation controller can be further configured to perform a recovery operation for an error in the partial data stored in the first memory group, and back up the partial data among the multi-bit data in the second memory group during the recovery operation.

The at least one program operation controller can be included in the at least one memory die.

The at least one program operation controller can be further configured to output a completion notice associated with the programming of the partial data after the partial data has been successively programmed in the first memory group.

The at least one program operation controller can program the parity in the second memory group after the outputting of the completion notice.

The partial data can include least significant bit (LSB) data among the multi-bit data. The logical operation includes an exclusive OR (XOR) operation performed while the program operation controller programs the multi-bit data into the first memory group through a multi-step program operation corresponding to a bit number of the multi-bit data.

The at least one program operation controller can be further configured to program the multi-bit data into the first memory group through a binary program operation and a foggy-fine program operation. The partial data can include data programmed in the binary program operation.

The at least one program operation controller can recover the partial data based on programmed values, which correspond to the partial data in the first memory group and the parity in the second memory group, during the verification operation performed after power is resumed.

The at least one program operation can determine whether the multi-bit data has been successively programmed based on a result of a verification operation after the recovered partial data is programmed in the first memory group.

The first memory group and the second memory group can be included in different memory blocks of a single memory die.

In another embodiment, an operating method of a memory device can include programming plural pieces of least significant bit (LSB) data and then remaining data into a first storage medium while programming a parity of the plural pieces into a second storage medium; and recovering, when the memory device is interrupted while programming the remaining data, the LSB data by utilizing the parity to program the recovered LSB data back into the first storage medium.

Embodiments will now be described with reference to the accompanying drawings, wherein like numbers reference like elements.

FIG. 1 illustrates an embodiment of a memory system according to an embodiment of the present disclosure.

Referring to FIG. 1, the memory system 110 can include a controller 130 and a memory device 150. The memory device 150 can include a plurality of non-volatile memory cells capable of storing data transmitted from an external device, e.g., a host 102 shown in FIG. 2. The memory device 150 can output stored data upon a request from the host 102. The controller 130 can control data input/output operations performed within the memory device 150 and perform data communication with the host 102. Components included in the memory system 110 will be described later, referring to FIGS. 2 and 3.

Referring to FIG. 1, the memory system 110 can include plural non-volatile memory cell regions. For example, the plural non-volatile memory cell regions include a first non-volatile cell region 522 and a second non-volatile cell region 524.

According to an embodiment, the first non-volatile cell region 522 and the second non-volatile cell region 524 can include different memory cells. For example, the first non-volatile cell region 522 can include plural memory cells, each memory call capable of storing multi-bit data, while the second non-volatile cell region 524 can include plural memory cells, each memory cell capable of storing single-bit data. In another example, both the first non-volatile cell region 522 and the second non-volatile cell region 524 can include memory cells capable of storing multi-bit data. In another example, each of plural memory cells included in the first non-volatile cell region 522 can store data having a greater number of bits than a memory cell included in the second non-volatile cell region 524.

The first non-volatile cell region 522 and the second non-volatile cell region 524 included in the memory system 110 can store different types of data. For example, the first non-volatile cell region 522 in the memory system 110 can store data transferred from an external device. The second non-volatile cell region 524 can store parity information of data stored in the first non-volatile cell region 522. Here, the parity information may be used to recover data programmed in the first non-volatile cell region 522 due to an interrupt or error occurring during an operation in which the multi-bit data is programmed in the first non-volatile cell region 522.

An operation of programming the multi-bit data can performed in multi stages within the first non-volatile cell region 522 including a memory cell capable of storing the multi-bit data. According to an embodiment, the memory system 110 can perform two-step or multi-step data programming operations to program the multi-bit data. In another embodiment, memory system 110 can perform foggy and fine data programming operations to program the multi-bit data. An operation performed by the memory system 110 for storing the multi-bit data will be described later with reference to FIGS. 7 to 9.

A one-shot programming operation is an operation in which plural ISPP step pulses are successively applied to a specific word line of the first non-volatile cell region 522 for programming a non-volatile memory cell until the non-volatile memory cell is fully programmed with multi-bit data. In the one-shot programming operation, while a unit program operation is performed through a specific word line, another unit program operation may not be performed through another word line. However, as an integration degree of the first non-volatile cell region 522 increases, a significant amount of cell-to-cell interference can occur in non-volatile memory cells coupled to word lines adjacent to a word line to which a one-shot program is performed, i.e., program pulses are applied, when there is no interleaving between program operations performed to word lines. In order to reduce an effect of the cell-to-cell interference, e.g., program interference, a two-step programming operation might be used for storing the multi-bit data in a non-volatile memory cell included in the first nonvolatile cell region 522. In the two-step programming operation, LSB data can be first programmed via a specific word line in non-volatile memory cells having a threshold voltage of the erase state (first step program). Then, MSB data can be programmed in the non-volatile memory cells (second step program) after another LSB data is programmed in other non-volatile memory cells connected to another word line adjacent to the specific word line. After LSB data is programmed in non-volatile memory cells connected to a plurality of word lines and then the MSB data is sequentially programmed therein, a cell-to-cell interference could be reduced.

In the memory system 110, a size of data stored in non-volatile memory cells connected to a plurality of word lines through a two-step programming operation is larger than a size of data stored in non-volatile memory cells connected to a single word line. A time spent on a two-step programming method for a voluminous data can be longer. If the memory system 110 can successfully program partial data among the multi-bit data in memory cells even though the multi-bit data is not completely programmed in the memory cells, the memory system 110 can determine that a data program operation for the partial data is complete and generate a completion associated with the partial data. Particularly, when a large amount of data is programmed in non-volatile memory cells connected to plural word lines in the first non-volatile cell region 522, the memory system 100 can notify that the data program operation for the partial data has been completed after the first step program operation is successfully completed before the second step program operation is successfully completed.

After the first step program operation in the first non-volatile cell region 522 is completed, the memory system 110 can determine that the partial data is programmed in the first non-volatile cell region 522 through the first step program operation in the memory device 150. For example, the memory system 110 can transmit a notification of completion (or a response) regarding a program command associated with the partial data to the host 102 which is an external device (refer to FIGS. 2 to 3). Through this notification, the host 102 can determine that a program operation corresponding to the program command is successfully completed in the memory system 110.

Although the first step program operation is completed in the first non-volatile cell region 522, the second step program operation might be being performed, and an error or an interrupt in the memory system 110 can occur while the second step program operation is being performed. After LSB data is programmed in non-volatile memory cells included in the first non-volatile cell region 522, a program operation might be abnormally terminated, halted, or stopped while MSB data is being programmed in the non-volatile memory cells. In this case, the memory system 110 should be able to ensure safety of the LSB data programmed in the first non-volatile cell region 522 through the first step program operation. That is, during the operation of programming data in the first non-volatile cell region 522 of the memory system 110, an interrupt (e.g., unexpected errors, power instability, or emergency) may occur in the first non-volatile cell region 522. Due to such an error or interrupt, the whole operation of programming the multi-bit data in the first non-volatile cell region 522 of the memory system 110 might not be completed. If the memory system 110 transmits a completion notification to the host 102 for specific, partial, or whole program data associated with a specific program command, the memory system 110 can safely store and restore the specific, partial, or whole program data, which corresponds to the completion notification, in the non-volatile cell region 522 to ensure safety of data input/output operations in the memory system 110.

For example, while the multi-bit data is programmed in the first non-volatile cell region 522, a completion notification has been sent after least significant bit (LSB) data among the multi-bit data would be first programmed into memory cells in the first non-volatile cell region 522. After the least significant bit (LSB) data of the multi-bit data is programmed, the program operation might be stopped due to an error or an interrupt while most significant bit (MSB) data of the multi-bit data is programmed. The memory system 110 can read and recover the LSB data already programmed among the multi-bit data from the first non-volatile cell region 522. However, it might be difficult to trust the LSB data read from the first non-volatile cell region 522 because the program operation is suddenly stopped. If parity information for the LSB data is stored in the second non-volatile cell region 524, the memory system 110 can restore the LSB data based on the parity information obtained from the second non-volatile cell region 524 and the LSB data read from the first non-volatile cell region 522.

The memory system 110 can include a parity generation engine 510 capable of generating the parity information to be stored in the second non-volatile cell region 524 based on the specific, partial, or whole program data stored in the first non-volatile cell region 522. According to an embodiment, the parity generation engine 510 can use an error correction code. However, if the parity generating engine 510 performs a complicated operation for generating parity information, speed and performance of the program operation performed by the memory system 110 might be degraded or reduced. Accordingly, the parity generation engine 510 could be designed so as not to deteriorate the speed and performance of the program operation.

According to an embodiment, the memory system 110 can use chipkill decoding capable of restoring original data even if an error occurs in multiple bits of the original data. A process in which the memory system 110 generates a chipkill parity will be described later with reference to FIG. 2. For example, error correction circuitry (ECC) 138 described in FIG. 2 can perform the chipkill decoding. For example, through the chipkill decoding, the memory system 110 can recover and restore a portion of the first non-volatile cell region 522 based on other data stored in other regions even if the portion of the first non-volatile cell region 522 could not be restored autonomously.

The memory system 110 can store data in the memory device 150 including the first non-volatile cell area 522 and the second non-volatile cell area 524 configured as a redundant array of independent (or inexpensive) disks (RAID). The memory system 110 can parallelize data input/output (I/O) of the disk while using a single volume with a large capacity through a RAID scheme. For example, the memory system 110 can store 5 pieces of data including 4 pieces of data having the same size (number of bits) and 1 piece of parity data generated based on the 4 pieces of data in plural different areas (e.g., RAID5). According to an embodiment, the memory system 110 can store four pieces of data having the same size (number of bits) and two pieces of parity data generated based on the four pieces of data (i.e., total six pieces of data) in plural different areas (e.g., RAID6). The parity generation engine 510 described in FIG. 1 can generate at least one piece of parity data based on plural pieces of write data.

For example, when four pieces of write data are stored in four different areas within the first non-volatile cell region 522, the parity generation engine 510 can generate one piece of parity data based on the four pieces of data. One piece of parity data can be stored in the second non-volatile cell region 524. If an error occurs in one of the four pieces of write data stored in the first non-volatile cell region 522, the parity generation engine 510 can recover the errored one of the four pieces of write data based on the other three pieces of write data among the four pieces of write data stored in the first non-volatile cell region 522 and the parity data stored in the second non-volatile cell region 524.

When LSB data among the multi-bit data is programmed in the first non-volatile cell region 522, the parity generation engine 510 can generate parity information for the LSB data. For example, a memory cell included in the first non-volatile cell region 522 may store three bits of data. The three-bit data can be divided into LSB data, CSB data, and MSB data. The memory system 110 may sequentially program LSB data, CSB data, and MSB data using a multi-step programming operation. That is, LSB page data, CSB page data, and MSB page data may be sequentially programmed into a plurality of memory cells connected by the same word line. In this case, after the LSB page data is programmed in the first non-volatile cell region 522, the parity generation engine 510 can store the parity information corresponding to the LSB page data in the second non-volatile cell region 522. Detailed operations of the parity generation engine 510 will be described later with reference to FIG. 11.

According to an embodiment, the parity generation engine 510 can generate parity information only for data which is transmitted from the external device (e.g., the host 102) and stored in the first non-volatile cell region 522. For example, while data is moved from a specific location to another location through garbage collection or wear leveling in the first non-volatile cell area 522, the parity generation engine 510 may not generate parity information for data internally moved or migrated within the memory system 110. Even if data migration is stopped by an error or an interrupt while data is moved, copied, or migrated within the first non-volatile cell region 522 through garbage collection or wear leveling, the data is still stored at a previous location in the first non-volatile cell region 522. Because a possibility of losing the migrated data is very low, the parity generating engine 510 in the memory system 110 might not generate parity information for the migrated data to increase operation efficiency of the memory system 110.

According to an embodiment of the present disclosure, early completion is notified for an operation of programming data in a non-volatile memory cell storing multi-bit data, but the multi-bit data might not be completely programmed in the non-volatile memory cell. In this case, the embodiment can provide an apparatus and a method for recovering write data based on other write data stored in a non-volatile memory cell and parity information corresponding to the write data and the other write data. An apparatus for programming data might reduce a size of parity information generated in response to write data being programmed, and the parity information may be stored in a region other than the area in which the write data is programmed. A memory device including non-volatile memory cells can include plural regions for storing write data and a region for storing parity corresponding to the write data.

Moreover, an apparatus and a method for programming write data in the memory system 110 can determine whether to generate parity information based on characteristics or attributes of data programmed in non-volatile memory cells. According to an embodiment, the parity information can be generated for write data input from an external device to be stored in the memory system 110. However, the parity information might not be generated in a process of copying, moving, or migrating data which has been stored in the memory system 110. For example, while the memory system 110 performs an operation such as garbage collection or wear leveling, the apparatus according to the embodiment might not generate parity information corresponding to data copied, moved, or migrated during the operation of garbage collection or wear leveling. The apparatus according to the embodiment can generate parity information regarding write data transmitted from the host 102 to the memory system 110 while programming the write data in the memory device 150.

The memory system 110 can reduce a size of parity information generated during a program operation by generating parity information for data corresponding to a least significant bit (LSB), which is a part of write data stored in a non-volatile memory cell storing the multi-bit data. Because the size of the parity information is small, overheads due to the operation of generating and storing the parity information during the program operation can be reduced. In addition, as the size of parity information generated during a program operation is reduced, a size of data for backing data up in an emergency such as sudden power off (SPO) can be reduced. Accordingly, a storage of the volatile memory device spent during an operation of generating parity information in the memory system might not be large, so that the storage of the non-volatile memory buffer storing the parity information might not be large. According to an embodiment, the apparatus for generating parity information can be included in a controller in the memory system. In another embodiment, the apparatus for generating parity information can be included in a memory die including non-volatile memory cells.

Hereinafter, descriptions will be made focusing on operations or components that can be technically distinguished between the controller 130 and the memory device 150 described in FIG. 1 and FIGS. 2 to 4. Specifically, a flash translation layer (FTL) 240 in the controller 130 will be described in more detail with reference to FIGS. 3 to 4.

According to an embodiment, roles and functions of the flash translation layer (FTL) in the controller 130 may be varied.

Figure 2:
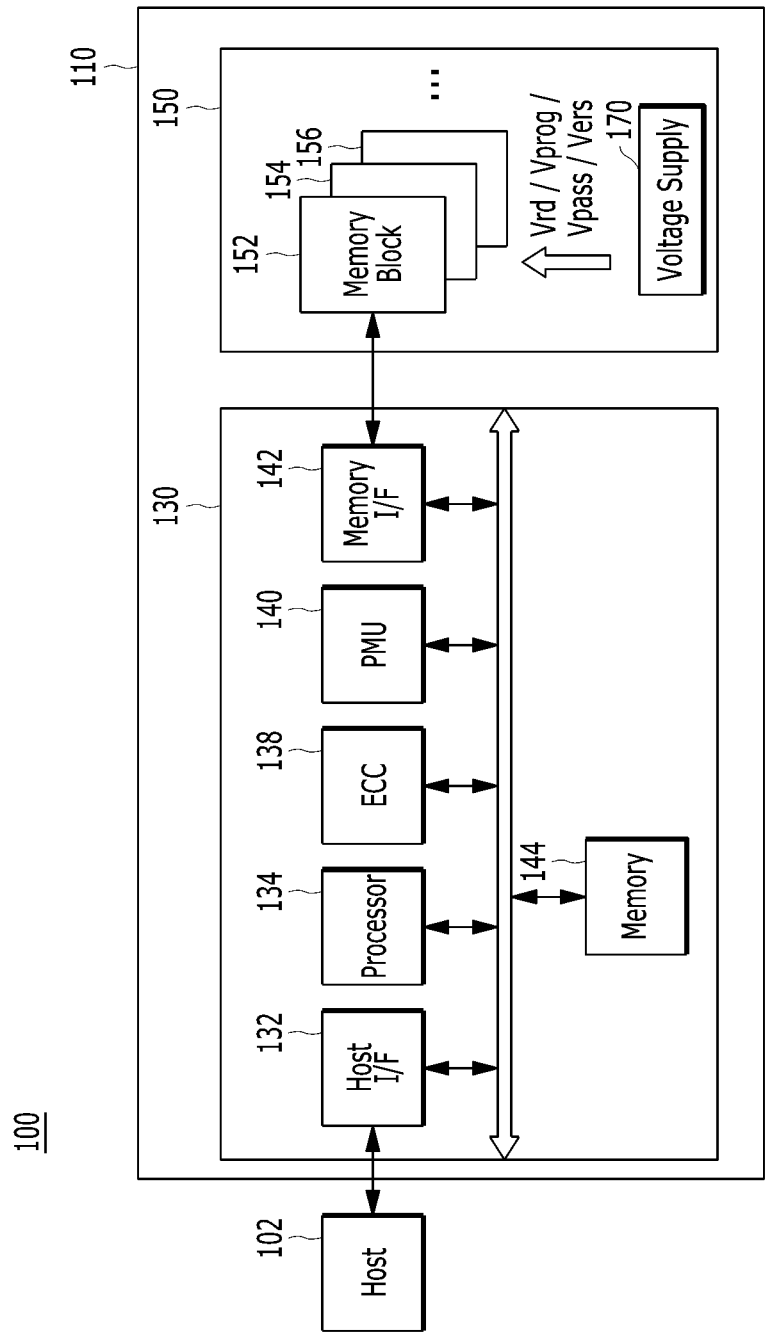
FIG. 2 illustrates a data processing system according to another embodiment of the present disclosure.
Figure 3:
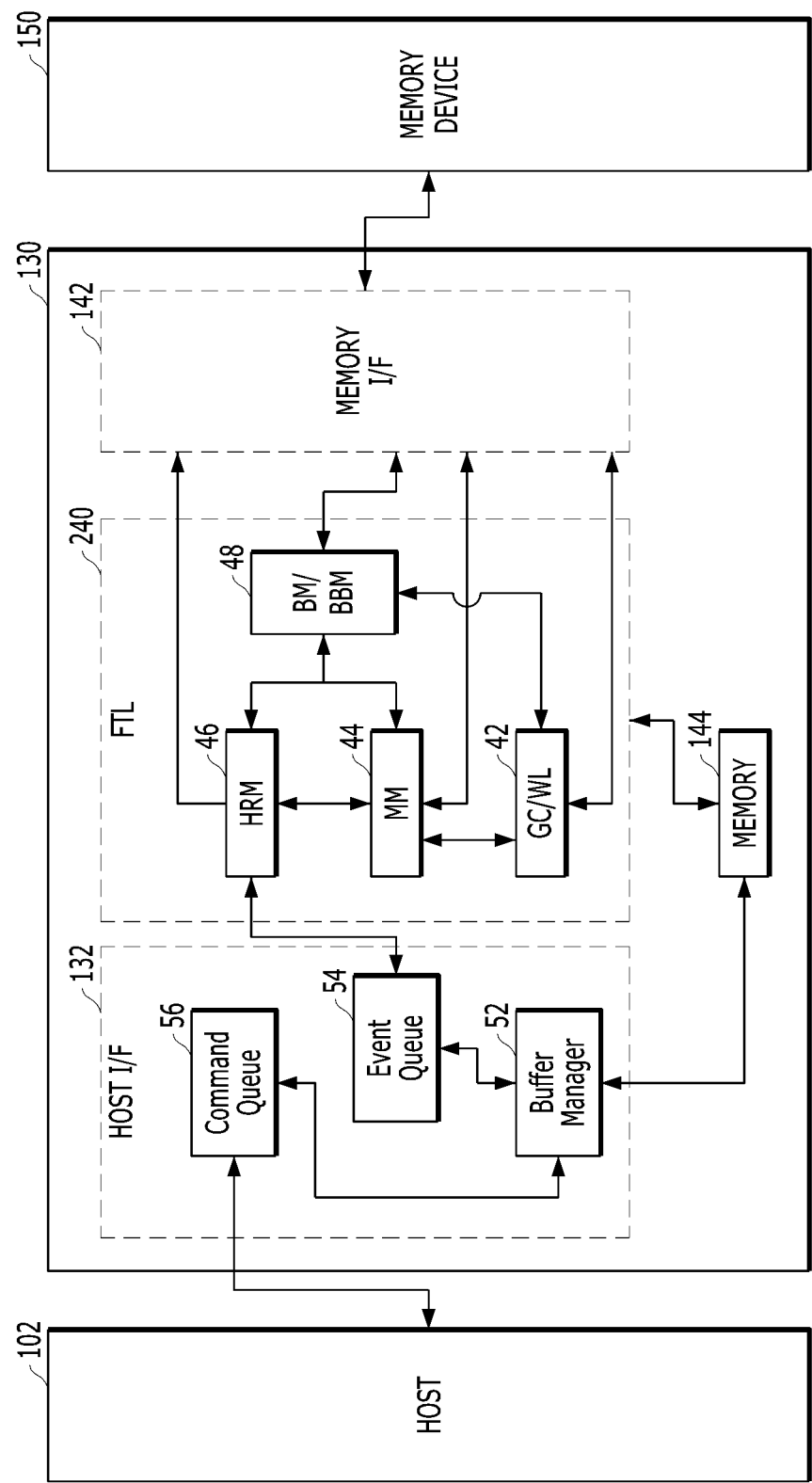
FIG. 3 illustrates a memory system according to another embodiment of the present disclosure.

FIGS. 2 and 3 illustrate some operations that may be performed by the memory system 110 according to one or more embodiments of the present disclosure.

Referring to FIG. 2, the data processing system 100 may include a host 102 engaged or coupled with a memory system, such as memory system 110. For example, the host 102 and the memory system 110 can be coupled to each other via a data bus, a host cable and the like to perform data communication.

The memory system 110 may include a memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements functionally divided. Further, according to an embodiment, the memory device 150 and the controller 130 may be implemented with a single chip or a plurality of chips. The controller 130 may perform a data input/output operation in response to a request input from the external device. For example, when the controller 130 performs a read operation in response to a read request input from an external device, data stored in a plurality of non-volatile memory cells included in the memory device 150 is transferred to the controller 130.

As shown in FIG. 2, the memory device 150 may include a plurality of memory blocks 152, 154, 156. The memory block 152, 154, 156 may be understood as a group of non-volatile memory cells in which data is removed together by a single erase operation. Although not illustrated, the memory block 152, 154, 156 may include a page which is a group of non-volatile memory cells that store data together during a single program operation or output data together during a single read operation. For example, one memory block may include a plurality of pages.

For example, the memory device 150 may include a plurality of memory planes or a plurality of memory dies. According to an embodiment, the memory plane may be considered a logical or a physical partition including at least one memory block, a driving circuit capable of controlling an array including a plurality of non-volatile memory cells, and a buffer that can temporarily store data inputted to, or outputted from, non-volatile memory cells.

In addition, according to an embodiment, the memory die may include at least one memory plane. The memory die may be understood to be a set of components implemented on a physically distinguishable substrate. Each memory die may be connected to the controller 130 through a data path. Each memory die may include an interface to exchange an item of data and a signal with the controller 130.

According to an embodiment, the memory device 150 may include at least one memory block 152, 154, 156, at least one memory plane, or at least one memory die. The internal configuration of the memory device 150 shown in FIGS. 1 and 2 may be different according to performance of the memory system 110. An embodiment of the present disclosure is not limited to the internal configuration shown in FIG. 2.

Referring to FIG. 2, the memory device 150 may include a voltage supply circuit 170 capable of supplying at least some voltage into the memory block 152, 154, 156. The voltage supply circuit 170 may supply a read voltage Vrd, a program voltage Vprog, a pass voltage Vpass, or an erase voltage Vers into a non-volatile memory cell included in the memory block. For example, during a read operation for reading data stored in the non-volatile memory cell included in the memory block 152, 154, 156, the voltage supply circuit 170 may supply the read voltage Vrd into a selected non-volatile memory cell. During the program operation for storing data in the non-volatile memory cell included in the memory block 152, 154, 156, the voltage supply circuit 170 may supply the program voltage Vprog into a selected non-volatile memory cell. Also, during a read operation or a program operation performed on the selected nonvolatile memory cell, the voltage supply circuit 170 may supply a pass voltage Vpass into a non-selected nonvolatile memory cell. During the erasing operation for erasing data stored in the non-volatile memory cell included in the memory block 152, 154, 156, the voltage supply circuit 170 may supply the erase voltage Vers into the memory block.

The memory device 150 may store information regarding various voltages which are supplied to the memory block 152, 154, 156 based on which operation is performed. For example, when a non-volatile memory cell in the memory block 152, 154, 156 can store multi-bit data, plural levels of the read voltage Vrd for recognizing or reading the multi-bit data item may be required. The memory device 150 may include a table including information corresponding to plural levels of the read voltage Vrd, corresponding to the multi-bit data item. For example, the table can include bias values stored in a register, each bias value corresponding to a specific level of the read voltage Vrd. The number of bias values for the read voltage Vrd that is used for a read operation may be limited to a preset range. Also, the bias values can be quantized.

The host 102 may include a portable electronic device, e.g., a mobile phone, an MP3 player, a laptop computer, etc., or a non-portable electronic device, e.g., a desktop computer, a game player, a television, a projector, etc.

The host 102 may also include at least one operating system (OS), which can control functions and operations performed in the host 102. The OS can provide interoperability between the host 102 engaged operatively with the memory system 110 and a user who intends to store data in the memory system 110. The OS may support functions and operations corresponding to user's requests. By way of example but not limitation, the OS can be classified into a general operating system and a mobile operating system according to mobility of the host 102. The general operating system may be split into a personal operating system and an enterprise operating system according to system requirements or a user environment. As compared with the personal operating system, the enterprise operating systems can be specialized for securing and supporting high performance computing.

The mobile operating system may be subject to support services or functions for mobility, e.g., a power saving function. The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to the plurality of commands within the memory system 110.

A controller 130 in the memory system 110 may control a memory device 150 in response to a request or a command input from the host 102. For example, the controller 130 may perform a read operation to provide data read from the memory device 150 to the host 102 and may perform a write operation (or a program operation) to store data input from the host 102 in the memory device 150. In order to perform data input/output (I/O) operations, the controller 130 may control and manage internal operations of reading data, programming data, erasing data, or the like.

According to an embodiment, the controller 130 may include a host interface 132, a processor 134, the error correction circuitry (ECC) 138, a power management unit (PMU) 140, a memory interface 142, and a memory 144. Components included in the controller 130 as illustrated in FIG. 2 may vary according to structures, functions, operation performance, or the like, regarding the memory system 110.

For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components may be added to or omitted from the controller 130 according to implementation of the memory system 110.

The host 102 and the memory system 110 each may include a controller or an interface for transmitting and receiving signals, data, and the like, in accordance with one or more predetermined protocols. For example, the host interface 132 in the memory system 110 may include an apparatus capable of transmitting signals, data, and the like to the host 102 or receiving signals, data, and the like from the host 102.

The host interface 132 included in the controller 130 may receive signals, commands (or requests), and/or data input from the host 102 via a bus. For example, the host 102 and the memory system 110 may use a predetermined set of rules or procedures for data communication or a preset interface to transmit and receive data therebetween. Examples of sets of rules or procedures for data communication standards or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like. According to an embodiment, the host interface 132 is a type of layer for exchanging data with the host 102 and is implemented with, or driven by, firmware called a host interface layer (HIL). According to an embodiment, the host interface 132 can include a command queue.

The Integrated Drive Electronics (IDE) or Advanced Technology Attachment (ATA) may be used as one of the interfaces for transmitting and receiving data and, for example, may use a cable including 40 wires connected in parallel to support data transmission and data reception between the host 102 and the memory system 110. When a plurality of memory systems 110 are connected to a single host 102, the plurality of memory systems 110 may be divided into a master and a slave by using a position or a dip switch to which the plurality of memory systems 110 are connected. The memory system 110 set as the master may be used as a main memory device. The IDE (ATA) may include, for example, Fast-ATA, ATAPI, or Enhanced IDE (EIDE).

A Serial Advanced Technology Attachment (SATA) interface is a type of serial data communication interface that is compatible with various ATA standards of parallel data communication interfaces which are used by Integrated Drive Electronics (IDE) devices. The 40 wires in the IDE interface can be reduced to six wires in the SATA interface. For example, 40 parallel signals for the IDE can be converted into 6 serial signals for the SATA interface. The SATA interface has been widely used because of its faster data transmission and reception rate and its less resource consumption in the host 102 used for the data transmission and reception. The SATA interface may connect up to 30 external devices to a single transceiver included in the host 102. In addition, the SATA interface can support hot plugging that allows an external device to be attached to or detached from the host 102, even while data communication between the host 102 and another device is being executed. Thus, the memory system 110 can be connected or disconnected as an additional device, like a device supported by a universal serial bus (USB) even when the host 102 is powered on. For example, in the host 102 having an eSATA port, the memory system 110 may be freely attached to or detached from the host 102 like an external hard disk.

Small Computer System Interface (SCSI) is a type of serial data communication interface used for connecting a computer or a server with other peripheral devices. The SCSI can provide a high transmission speed, as compared with other interfaces such as IDE and SATA. In the SCSI, the host 102 and at least one peripheral device (e.g., memory system 110) are connected in series, but data transmission and reception between the host 102 and each peripheral device may be performed through a parallel data communication. In the SCSI, it is easy to connect or disconnect a device such as the memory system 110 to or from the host 102. The SCSI can support connections of 15 other devices to a single transceiver included in host 102.

Serial Attached SCSI (SAS) can be understood as a serial data communication version of the SCSI. In the SAS, the host 102 and a plurality of peripheral devices are connected in series, and data transmission and reception between the host 102 and each peripheral device may be performed in a serial data communication scheme. The SAS can support connection between the host 102 and the peripheral device through a serial cable instead of a parallel cable, to easily manage equipment using the SAS and enhance or improve operational reliability and communication performance. The SAS may support connections of eight external devices to a single transceiver included in the host 102.

The Non-volatile memory express (NVMe) is a type of interface based at least on a Peripheral Component Interconnect Express (PCIe) designed to increase performance and design flexibility of the host 102, servers, computing devices, and the like equipped with the non-volatile memory system 110. The PCIe can use a slot or a specific cable for connecting a computing device (e.g., host 102) and a peripheral device (e.g., memory system 110). For example, the PCIe can use a plurality of pins (e.g., 18 pins, 32 pins, 49 pins, or 82 pins) and at least one wire (e.g., ×1, ×4, ×8, or ×16) to achieve high speed data communication over several hundred MB per second (e.g., 250 MB/s, 500 MB/s, 984.6250 MB/s, or 1969 MB/s). According to an embodiment, the PCIe scheme may achieve bandwidths of tens to hundreds of Giga bits per second. The NVMe can support an operation speed of the non-volatile memory system 110, such as an SSD, that is faster than a hard disk.

According to an embodiment, the host 102 and the memory system 110 may be connected through a universal serial bus (USB). The Universal Serial Bus (USB) is a type of scalable, hot-pluggable plug-and-play serial interface that can provide cost-effective standard connectivity between the host 102 and peripheral devices such as a keyboard, a mouse, a joystick, a printer, a scanner, a storage device, a modem, a video camera, and the like. A plurality of peripheral devices such as the memory system 110 may be coupled to a single transceiver included in the host 102.

Referring to FIG. 2, the error correction circuitry 138 can correct error bits of data read from the memory device 150, and may include an error correction code (ECC) encoder and an ECC decoder. The ECC encoder may perform error correction encoding of data to be programmed in the memory device 150 to generate encoded data into which a parity bit is added, and store the encoded data in the memory device 150. The ECC decoder can detect and correct error bits contained in the data read from the memory device 150 when the controller 130 reads the data stored in the memory device 150. For example, after performing error correction decoding on the data read from the memory device 150, the error correction circuitry 138 determines whether the error correction decoding has succeeded or not, and outputs an instruction signal, e.g., a correction success signal or a correction fail signal, based on a result of the error correction decoding. The error correction circuitry 138 may use a parity bit, which has been generated during the ECC encoding process for the data stored in the memory device 150, in order to correct the error bits of the read data. When the number of the error bits is greater than or equal to the number of correctable error bits, the error correction circuitry 138 may not correct the error bits and instead may output the correction fail signal indicating failure in correcting the error bits.

According to an embodiment, the error correction circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above described codes. The error correction circuitry 138 shown in FIG. 2 can include at least some of the components included in the controller 130 shown in FIG. 1.

For example, the ECC decoder may perform hard decision decoding or soft decision decoding on data transmitted from the memory device 150. The hard decision decoding can be understood as one of two methods broadly classified for error correction. The hard decision decoding may include an operation of correcting an error bit by reading digital data of '0' or '1' from a non-volatile memory cell in the memory device 150. Because the hard decision decoding handles a binary logic signal, the circuit/algorithm design or configuration may be simpler and a processing speed may be faster than the soft decision decoding.

The soft decision decoding may quantize a threshold voltage of a non-volatile memory cell in the memory device 150 by two or more quantized values, e.g., multiple bit data, approximate values, an analog value, and the like, in order to correct an error bit based on the two or more quantized values. The controller 130 can receive two or more alphabets or quantized values from a plurality of non-volatile memory cells in the memory device 150, and then perform a decoding based on information generated by characterizing the quantized values as a combination of information such as conditional probability or likelihood.

According to an embodiment, the ECC decoder may use a low-density parity-check and generator matrix (LDPC-GM) code among methods designed for the soft decision decoding. The low-density parity-check (LDPC) code uses an algorithm that can read values of data from the memory device 150 in several bits according to reliability, not simply data of 1 or 0 like the hard decision decoding, and iteratively repeats it through a message exchange in order to improve reliability of the values. Then, the values are finally determined as data of 1 or 0. For example, a decoding algorithm using LDPC codes can be understood as probabilistic decoding. The hard decision decoding in which a value output from a non-volatile memory cell is coded as 0 or 1. Compared to the hard decision decoding, the soft decision decoding can determine the value stored in the non-volatile memory cell based on the stochastic information. Regarding bit-flipping which may be considered an error that can occur in the memory device 150, the soft decision decoding may provide improved probability of correcting the error and recovering data, as well as providing reliability and stability of corrected data. The LDPC-GM code may have a scheme in which internal LDGM codes can be concatenated in series with high-speed LDPC codes.

According to an embodiment, the ECC decoder may use, for example, low-density parity-check convolutional codes (LDPC-CCs) for the soft decision decoding. The LDPC-CCs may have a scheme using a linear time encoding and a pipeline decoding based on a variable block length and a shift register.

According to an embodiment, the ECC decoder may use, for example, a Log Likelihood Ratio Turbo Code (LLR-TC) for the soft decision decoding. A Log Likelihood Ratio (LLR) may be calculated as a non-linear function for a distance between a sampled value and an ideal value. In addition, a Turbo Code (TC) may include a simple code, for example, a Hamming code, in two or three dimensions and repeat decoding in a row direction and a column direction to improve reliability of values.

The power management unit (PMU) 140 may control electrical power provided to the controller 130. The PMU 140 may monitor the electrical power supplied to the memory system 110, e.g., a voltage supplied to the controller 130, and provide the electrical power to components included in the controller 130. The PMU 140 may not only detect power-on or power-off, but also generate a trigger signal to enable the memory system 110 to urgently back up a current state when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request input from the host 102. The memory interface 142 may generate a control signal for the memory device 150 and may process data input to, or output from, the memory device 150 under the control of the processor 134 in a case when the memory device 150 is a flash memory.

For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The memory 144 may be used as a working memory of the memory system 110 or the controller 130, while temporarily storing transactional data of operations performed in the memory system 110 and the controller 130. For example, the memory 144 may temporarily store read data output from the memory device 150 in response to a read request from the host 102 before the read data is output to the host 102. In addition, the controller 130 may temporarily store write data input from the host 102 in the memory 144 before programming the write data in the memory device 150. When the controller 130 controls operations, such as a data read operation, a data write or program operation, a data erase operation, etc., of the memory device 150, data transmitted between the controller 130 and the memory device 150 of the memory system 110 may be temporarily stored in the memory 144.

In addition to the read data or write data, the memory 144 may store information, e.g., map data, read requests, program requests, etc. used for inputting or outputting data between the host 102 and the memory device 150. According to an embodiment, the memory 144 may include one or more of a command queue, a program memory, a data memory, a write buffer/cache, a read buffer/cache, a data buffer/cache, a map buffer/cache, and so on. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates, for example, the memory 144 disposed within the controller 130, embodiments are not limited thereto. The memory 144 may be located within or external to the controller 130. For instance, the memory 144 may be embodied by an external volatile memory having a memory interface transferring data and/or signals between the memory 144 and the controller 130.

The processor 134 may control the overall operations of the memory system 110. For example, the processor 134 can control a program operation or a read operation of the memory device 150 in response to a write request or a read request entered from the host 102. According to an embodiment, the processor 134 may execute firmware to control the program operation or the read operation in the memory system 110. Herein, the firmware may be referred to as a flash translation layer (FTL). An example of the FTL will be described in detail, referring to FIGS. 3 and 4. According to an embodiment, the processor 134 may be implemented with a microprocessor, a central processing unit (CPU), or the like.

According to an embodiment, the memory system 110 may be implemented with at least one multi-core processor. The multi-core processor is a type of circuit or chip in which two or more cores, which are considered distinct processing regions, are integrated. For example, when a plurality of cores in the multi-core processor drive or execute a plurality of flash translation layers (FTLs) independently, a data input/output speed (or performance) of the memory system 110 may be improved. According to an embodiment, the data input/output (I/O) operations in the memory system 110 may be independently performed through different cores in the multi-core processor.

The processor 134 in the controller 130 may perform an operation corresponding to a request or a command input from the host 102. Further, the memory system 110 may perform an operation independent from a command or a request input from the host 102. In one case, an operation performed by the controller 130 in response to the request or the command input from the host 102 may be considered a foreground operation, while an operation performed by the controller 130 independently from the request or the command input from the host 102 may be considered a background operation. The controller 130 can perform foreground or background operations for reading, writing, or erasing data in the memory device 150. In addition, a parameter set operation corresponding to a set parameter command or a set feature command as a set command transmitted from the host 102 may be considered a foreground operation. Background operations that can be performed without a command transmitted from the host 102 by the controller 130 include garbage collection (GC), wear leveling (WL), bad block management for identifying and processing bad blocks, or the like.

According an embodiment, substantially similar operations may be performed as both the foreground operation and the background operation. For example, when the memory system 110 performs garbage collection in response to a request or a command input from the host 102 (e.g., Manual GC), the garbage collection can be considered a foreground operation. When the memory system 110 performs garbage collection independently of the host 102 (e.g., Auto GC), the garbage collection can be considered a background operation.

When the memory device 150 includes a plurality of dies (or a plurality of chips) each including a plurality of non-volatile memory cells, the controller 130 may perform parallel processing regarding plural requests or commands input from the host 102 in order to improve performance of the memory system 110. For example, the transmitted requests or commands may be divided into plural groups including at least some of a plurality of planes, a plurality of dies, or a plurality of chips included in the memory device 150, and the plural groups of requests or commands are processed individually or in parallel in each plane, each die or each chip.

The memory interface 142 in the controller 130 may be connected to the plurality of dies or chips in the memory device 150 through at least one channel and at least one way. When the controller 130 distributes and stores data in the plurality of dies through each channel or each way in response to requests or commands associated with a plurality of pages including non-volatile memory cells, a plurality of operations corresponding to the requests or the commands can be performed simultaneously or in parallel in the plurality of dies or planes. Such a processing method or scheme can be considered to be an interleaving method. Because a data input/output speed of the memory system 110 increases by operating with the interleaving method, data I/O performance of the memory system 110 can be improved.

By way of example but not limitation, the controller 130 can recognize statuses of a plurality of channels (or ways) associated with the plurality of dies included in the memory device 150. The controller 130 may determine a status of each channel or each way as one of a busy status, a ready status, an active status, an idle status, a normal status, and an abnormal status. The determination of which channel or way an instruction (and/or a data) is delivered through by the controller can be associated with a physical block address. The controller 130 may refer to descriptors delivered from the memory device 150. The descriptors may include a block or page of parameters describing something about the memory device 150. The descriptors can have a predetermined format or structure. For instance, the descriptors may include device descriptors, configuration descriptors, unit descriptors, and the like. The controller 130 may refer to, or use, the descriptors to determine which channel(s) or way(s) is used to exchange an instruction or data.

Referring to FIG. 2, the memory device 150 in the memory system 110 may include a plurality of memory blocks 152, 154, 156. Each of the plurality of memory blocks 152, 154, 156 includes a plurality of non-volatile memory cells. According to an embodiment, the memory block 152, 154, 156 can be a group of non-volatile memory cells erased together. The memory block 152, 154, 156 may include a plurality of pages which is a group of non-volatile memory cells read or programmed together.

In one embodiment, each memory block 152, 154, or 156 may have a three-dimensional stack structure for a high integration. Further, the memory device 150 may include a plurality of dies, each die including a plurality of planes, each plane including the plurality of memory blocks 152, 154, 156. A configuration of the memory device 150 may be changed depending on performance of the memory system 110.

FIG. 2 illustrates the memory device 150 that includes the plurality of memory blocks 152, 154, and 156. The plurality of memory blocks 152, 154, and 156 may be any of single-level cell (SLC) memory blocks, multi-level cell (MLC) memory blocks, or the like, according to the number of bits that can be stored in one memory cell. An SLC memory block includes a plurality of pages implemented by memory cells, each memory cell storing one bit of data. An SLC memory block may have higher data I/O operation performance and higher durability than the MLC memory block. The MLC memory block includes a plurality of pages implemented by memory cells, each memory cell storing multi-bit data, e.g., two or more bits of data. The MLC memory block may have larger storage capacity for the same space compared to the SLC memory block. The MLC memory block can be highly integrated in a view of storage capacity.

In an embodiment, the memory device 150 may be implemented with MLC memory blocks such as a double level cell (DLC) memory block, a triple-level cell (TLC) memory block, a quadruple-level cell (QLC) memory block, and a combination thereof. The DLC memory block may include a plurality of pages implemented by memory cells, each memory cell capable of storing 2-bit data. The TLC memory block can include a plurality of pages implemented by memory cells, each memory cell capable of storing 3-bit data. The QLC memory block can include a plurality of pages implemented by memory cells, each memory cell capable of storing 4-bit data. In another embodiment, the memory device 150 can be implemented with a block including a plurality of pages implemented by memory cells, each memory cell capable of storing five or more bits of data.

According to an embodiment, the controller 130 may use an MLC memory block included in the memory device 150 as an SLC memory block that stores one-bit data in one memory cell. A data input/output speed of the multi-level cell (MLC) memory block can be slower than that of the SLC memory block. That is, when the MLC memory block is used as the SLC memory block, a margin for a read or program operation can be reduced. For example, the controller 130 may perform a data input/output operation with a higher speed when the MLC memory block is used as the SLC memory block. Thus, the controller 130 may use the MLC memory block as an SLC buffer to temporarily store data because the buffer may require a high data input/output speed for improving performance of the memory system 110.

Further, according to an embodiment, the controller 130 can program data in an MLC a plurality of times without performing an erase operation on a specific MLC memory block included in the memory device 150. In general, non-volatile memory cells do not support data overwrite. However, the controller 130 may program 1-bit data in the MLC a plurality of times using a feature in which the MLC is capable of storing multi-bit data. For an MLC overwrite operation, the controller 130 may store the number of program times as separate operation information when 1-bit data is programmed in an MLC. According to an embodiment, an operation for uniformly levelling threshold voltages of the MLCs may be carried out before another 1-bit data is programmed in the same MLCs, each having stored another-bit data.

In an embodiment, the memory device 150 is embodied as a non-volatile memory such as a flash memory, for example, as a NAND flash memory, a NOR flash memory, or the like. In another embodiment, the memory device 150 may be implemented by at least one of a phase change random access memory (PCRAM), a ferroelectrics random access memory (FRAM), a spin transfer torque random access memory (SU-RAM), and a spin transfer torque magnetic random access memory (STT-MRAM), or the like.

Referring to FIG. 3, the controller 130 in a memory system operates along with the host 102 and the memory device 150. As illustrated, the controller 130 includes the host interface 132, a flash translation layer (FTL) 240, the memory interface 142, and the memory 144 previously identified with reference to FIG. 2.

According to an embodiment, the error correction circuitry 138 illustrated in FIG. 2 may be included in the flash translation layer (FTL) 240. In another embodiment, the error correction circuitry 138 may be implemented as a separate module, a circuit, firmware, or the like, which is included in or associated with the controller 130.

The host interface 132 may handle commands, data, and the like transmitted from the host 102. By way of example but not limitation, the host interface 132 may include a command queue 56, a buffer manager 52, and an event queue 54. The command queue 56 may sequentially store the commands, the data, and the like received from the host 102, and output them to the buffer manager 52, for example, in an order in which they are stored in the command queue 56. The buffer manager 52 may classify, manage, or adjust the commands, the data, and the like received from the command queue 56. The event queue 54 may sequentially transmit events for processing the commands, the data, and the like received from the buffer manager 52.

A plurality of commands or data of the same characteristic may be transmitted from the host 102, or a plurality of commands and data of different characteristics may be transmitted to the memory system 110 after being mixed or jumbled by the host 102. For example, a plurality of commands for reading data, i.e., read commands, may be delivered, or a command for reading data, i.e., a read command, and a command for programming/writing data, i.e., a write command, may be alternately transmitted to the memory system 110. The host interface 132 may sequentially store commands, data, and the like, which are transmitted from the host 102, in the command queue 56. Thereafter, the host interface 132 may estimate or predict what type of internal operations the controller 130 will perform according to the characteristics of the commands, the data, and the like, which have been transmitted from the host 102. The host interface 132 may determine a processing order and a priority of commands, data and the like based on their characteristics.

According to the characteristics of the commands, the data, and the like transmitted from the host 102, the buffer manager 52 in the host interface 132 is configured to determine whether the buffer manager 52 should store the commands, the data, and the like in the memory 144, or whether the buffer manager 52 should deliver the commands, the data, and the like to the flash translation layer (FTL) 240. The event queue 54 receives events, transmitted from the buffer manager 52, which are to be internally executed and processed by the memory system 110 or the controller 130 in response to the commands, the data, and the like, and delivers the events to the flash translation layer (FTL) 240 in the order of the events input to the event queue 54.

In accordance with an embodiment, the flash translation layer (FTL) 240 illustrated in FIG. 3 may implement a multi-thread scheme to perform data input/output (I/O) operations. A multi-thread FTL may be implemented through a multi-core processor using multi-thread included in the controller 130.

In accordance with an embodiment, the flash translation layer (FTL) 240 may include a host request manager (HRM) 46, a map manager (MM) 44, a state manager 42, and a block manager 48. The host request manager (HRM) 46 may manage the events transmitted from the event queue 54. The map manager (MM) 44 may handle or control map data. The state manager 42 may perform garbage collection (GC) or wear leveling (WL). The block manager 48 may execute commands or instructions onto a block in the memory device 150.

By way of example but not limitation, the host request manager (HRM) 46 may use the map manager (MM) 44 and the block manager 48 to handle or process requests according to read and program commands and events which are delivered from the host interface 132. The host request manager (HRM) 46 may send an inquiry request to the map manager (MM) 44 to determine a physical address corresponding to a logical address which is entered with the events. The host request manager (HRM) 46 may send a read request with the physical address to the memory interface 142 to process the read request, i.e., handle the events. In one embodiment, the host request manager (HRM) 46 may send a program request (or a write request) to the block manager 48 to program data to a specific empty page storing no data in the memory device 150, and then may transmit a map update request corresponding to the program request to the map manager (MM) 44 in order to update an item relevant to the programmed data in information of mapping the logical and physical addresses to each other.

The block manager 48 may convert a program request delivered from the host request manager (HRM) 46, the map manager (MM) 44, and/or the state manager 42 into a flash program request used for the memory device 150, in order to manage flash blocks in the memory device 150. In order to maximize or enhance program or write performance of the memory system 110, the block manager 48 may collect program requests and send flash program requests for multiple-plane and one-shot program operations to the memory interface 142. In an embodiment, the block manager 48 sends several flash program requests to the memory interface 142 to enhance or maximize parallel processing of a multi-channel and multi-directional flash controller.

In an embodiment, the block manager 48 may manage blocks in the memory device 150 according to the number of valid pages, select and erase blocks having no valid pages when a free block is needed, and select a block including the least number of valid pages when it is determined that garbage collection is to be performed. The state manager 42 may perform garbage collection to move valid data stored in the selected block to an empty block and erase data stored in the selected block so that the memory device 150 may have enough free blocks (i.e., empty blocks with no data). When the block manager 48 provides information regarding a block to be erased to the state manager 42, the state manager 42 may check all flash pages of the block to be erased to determine whether each page of the block is valid.

For example, to determine validity of each page, the state manager 42 may identify a logical address recorded in an out-of-band (OOB) area of each page. To determine whether each page is valid, the state manager 42 may compare a physical address of the page with a physical address mapped to a logical address obtained from an inquiry request. The state manager 42 sends a program request to the block manager 48 for each valid page. A map table may be updated by the map manager 44 when a program operation is complete.

The map manager 44 may manage map data, e.g., a logical-physical map table. The map manager 44 may process various requests, for example, queries, updates, and the like, which are generated by the host request manager (HRM) 46 or the state manager 42. The map manager 44 may store the entire map table in the memory device 150, e.g., a flash/non-volatile memory, and cache mapping entries according to the storage capacity of the memory 144. When a map cache miss occurs while processing inquiry or update requests, the map manager 44 may send a read request to the memory interface 142 to load a relevant map table stored in the memory device 150. When the number of dirty cache blocks in the map manager 44 exceeds a certain threshold value, a program request may be sent to the block manager 48, so that a clean cache block is made and a dirty map table may be stored in the memory device 150.

When garbage collection is performed, the state manager 42 copies valid page(s) into a free block, and the host request manager (HRM) 46 may program the latest version of the data for the same logical address of the page and currently issue an update request. When the state manager 42 requests the map update in a state in which the copying of the valid page(s) is not completed normally, the map manager 44 might not perform the map table update. This is because the map request is issued with old physical information when the state manger 42 requests a map update and a valid page copy is completed later. The map manager 44 may perform a map update operation to ensure accuracy when, or only if, the latest map table still points to the old physical address.

Figure 4:
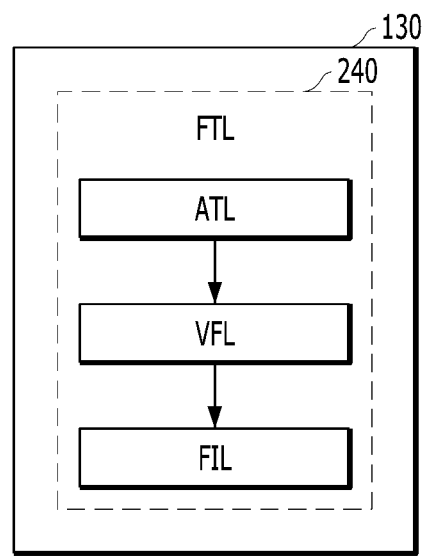
FIG. 4 illustrates internal configuration included in a controller shown in FIGS. 1 to 3 according to embodiments of the present disclosure.

FIG. 4 illustrates internal configuration of the controller shown in FIGS. 1 to 3 according to an embodiment of the present disclosure.

Referring to FIG. 4, the flash translation layer (FTL) 240 in the controller 130 can be divided into three layers: an address translation layer ATL; a virtual flash layer VFL; and a flash Interface Layer FIL.

For example, the address translation layer ATL may convert a logical address LA transmitted from a file system into a logical page address. The address translation layer ATL can perform an address translation process regarding a logical address space. That is, the address translation layer ATL can perform an address translation process based on mapping information to which the logical page address LPA of the flash memory 140 is mapped to the logical address LA transmitted from the host. Such logical-to-logical address mapping information (hereinafter referred to as L2L mapping) may be stored in an area in which metadata is stored in the memory device 150.

The virtual flash layer VFL may convert the logical page address LPA, which is mapped by the address translation layer ATL, into a virtual page address VPA. Here, the virtual page address VPA may correspond to a physical address of a virtual memory device. That is, the virtual page address VPA may correspond to the memory block 60 in the memory device 150. If there is a bad block among the memory blocks 60 in the memory device 150, the bad block may be excluded by the virtual flash layer VFL. In addition, the virtual flash layer VFL can include a recovery algorithm for scanning a scan area to restore the logical-to-virtual address mapping information (L2V mapping) stored in the memory device 150 and mapping information in the data region for storing user data. The recovery algorithm can be capable of recovering the logical-to-virtual address mapping information (L2V mapping). The virtual flash layer VFL may perform an address conversion process regarding the virtual address space, based on the logical-to-virtual address mapping information (L2V mapping) restored through the recovery algorithm.

The flash interface layer FIL can convert a virtual page address of the virtual flash layer VFL into a physical page address of the memory device 150. The flash interface layer FIL performs a low-level operation for interfacing with the memory device 150. For example, the flash interface layer FIL can include a low-level driver for controlling hardware of the memory device 150, an error correction code (ECC) for checking and correcting an error in data transmitted from the memory device 150, and a module for performing operations such as Bad Block Management (BBM).

Figure 5:
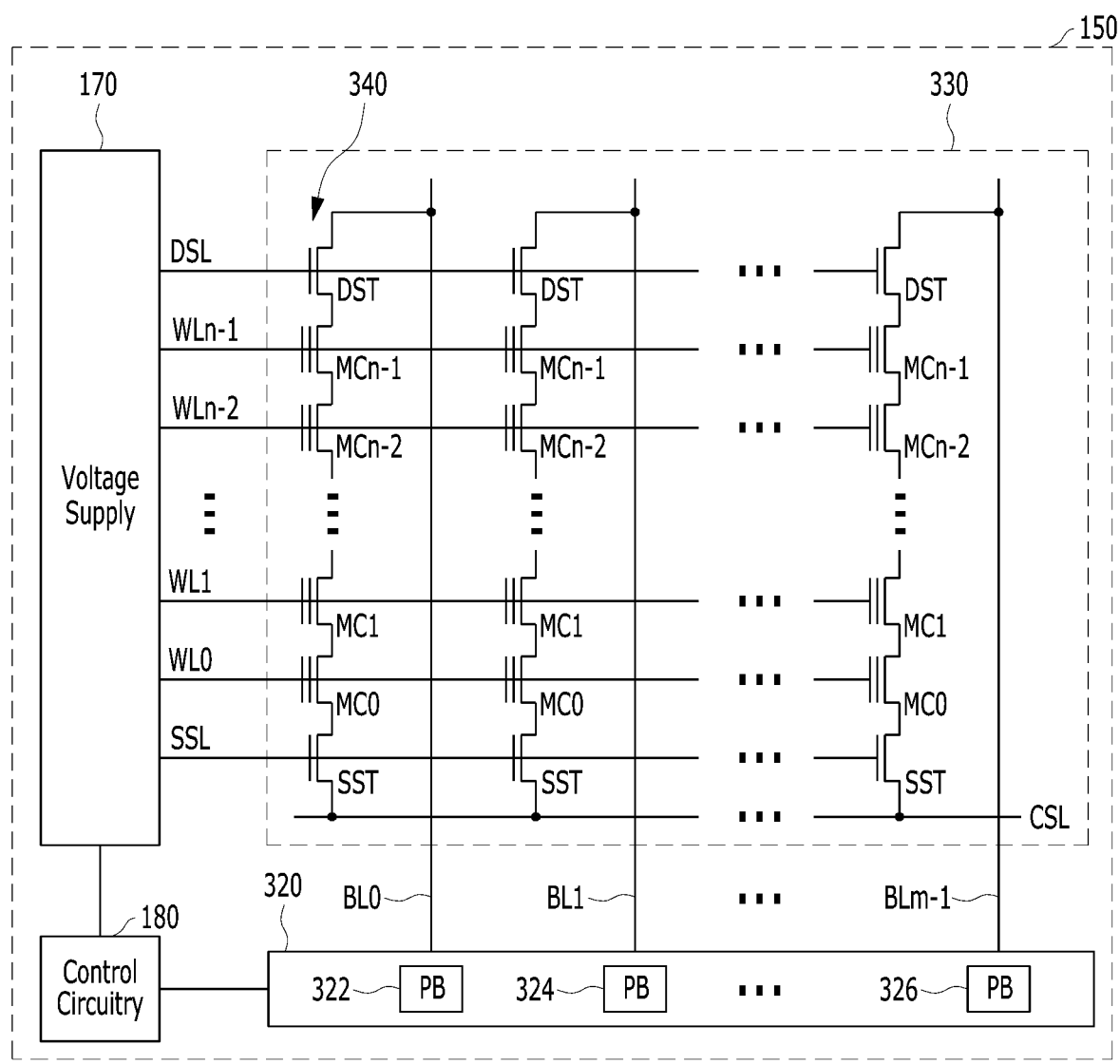
FIG. 5 illustrates an operation timing for confirming an operation state and an operation result of planes included in a memory system according to an embodiment of the present disclosure.

FIG. 5 illustrates an operation timing for confirming an operation state and an operation result of planes included in a memory system in accordance with an embodiment of the present disclosure. Specifically, FIG. 5 schematically illustrates a memory cell array circuit in a memory die or memory plane included in the memory device 150 according to an embodiment of the present disclosure.

Referring to FIG. 5, the memory device 150 may include at least one memory group 330 having a plurality of cell strings 340. Each cell string 340 may include a plurality of non-volatile memory cells MC0 to MCn−1 connected to a respective one of a plurality of bit lines BL0 to BLm−1. The cell strings 340 are disposed in respective columns of the memory group 330, and each cell string 340 can include at least one drain select transistor DST and at least one source select transistor SST. The non-volatile memory cells MC0 to MCn−1 of each cell string 340 may be connected in series between a drain select transistor DST and a source select transistor SST. Each of the non-volatile memory cells MC0 to MCn−1 may be configured as a multi-level cell (MLC) that stores a data item having plural bits per cell. The cell strings 340 may be electrically connected to corresponding ones of the bit lines BL0 to BLm−1.

In the embodiment shown in FIG. 5, the memory group 330 may include NAND-type flash memory cells MC0 to MCn−1. In another embodiment, the memory group 330 can be implemented as a NOR-type flash memory, a hybrid flash memory in which at least two different types of memory cells are mixed or combined, or a one-chip NAND flash memory in which a controller is embedded in a single memory chip. In an embodiment, the memory group 330 can include a flash memory cell including a charge trap flash (CTF) layer that includes a conductive floating gate or insulating layer.

FIG. 5 shows an embodiment of a memory system 110 which may include the memory device 150. In this embodiment, the memory group 330 in memory device 150 may include one or more memory blocks 152, 154, 156. According to an embodiment, the memory device 150 can have a two-dimensional (2D) or three-dimensional (3D) structure. For example, each of the memory blocks 152, 154, 156 in the memory device 150 may be implemented as a 3D structure or a vertical structure. Each of the memory blocks 152, 154, 156 may have a three-dimensional structure extending along first to third directions, for example, an x-axis direction, a y-axis direction, and a z-axis direction.

The memory group 330 including the plurality of memory blocks 152, 154, 156 can be coupled to a plurality of bit lines BL, a plurality of string select lines SSL, and a plurality of drain select lines DSL, a plurality of word lines WL, a plurality of dummy word lines DWL, and a plurality of common source lines CSL. In an embodiment, the memory group 330 can include a plurality of NAND strings NS which, for example, may respectively correspond to cell strings 340. Each NAND string NS may include a plurality of memory cells MC and may be connected to a respective one of the bit lines BL. In addition, the string select transistor SST of each NAND string NS may be connected to a common source line CSL, and the drain select transistor DST of each NAND string NS can be connected to a corresponding bit line BL. In each NAND string NS, the memory cells MC may be arranged between the string select transistor SST and the drain select transistor DST.

Referring to FIG. 5, the memory device 150 can include a voltage supply circuit 170 which can supply a word line voltage, e.g., one or more predetermined voltages such as a program voltage, a read voltage, and a pass voltage, for respective word lines according to an operation mode, or may supply a voltage to a bulk (e.g., a well region) in which each memory block including the memory cells MC are formed. In this case, a voltage generating operation of the voltage supply circuit 170 may be performed under a control of a control circuitry 180. Also, the voltage supply circuit 170 may generate a plurality of variable read voltages to distinguish a plurality of data items from each other. The plurality of variable read voltages can be applied to non-volatile memory cells in the memory group 330.

In response to the control of the control circuit, one of the memory blocks (or sectors) of the memory cell array may be selected, and one of the word lines of the selected memory block may be selected. Word line voltages may be supplied to the selected word line and the unselected word line, individually. The voltage supply circuit 170 may include a voltage generation circuit (e.g., refer to FIGS. 6 to 8) for generating target voltages having various levels.

In an embodiment, the voltage supply circuit 170 may be coupled to a first pin or pad receiving a first power voltage VCC applied from the outside (e.g., an external device) and a second pin or pad receiving the second power voltage VPP applied from the external device. The second power voltage VPP may have a greater voltage level, e.g., twice or more higher than that of the first power voltage VCC. For example, the first power voltage VCC may have a voltage level of 2.0V to 5.5V, while the second power supply voltage may have a voltage level of 9V to 13V.

According to an embodiment, the voltage supply circuit 170 can include a voltage generation circuit for more rapidly generating the target voltages of various levels used in the memory group 330. The voltage generation circuit can use the second power supply voltage VPP to generate a target voltage, which may have a higher voltage level than the second power voltage VPP.

The memory device 150 may also include a read/write circuit 320 controlled by the control circuitry 180. The read/write circuit 320 may operate as a sense amplifier or a write driver according to an operation mode. For example, in a verify operation and a read operation, the read/write circuit 320 may operate as a sense amplifier for reading the data item from the memory cell array. In a program operation, the read/write circuit 320 may operate as a write driver that controls potentials of bit lines according to a data item to be stored in the memory cell array. The read/write circuit 320 may receive the data item to be programmed to the cell array from page buffers during the program operation. The read/write circuit 320 can drive bit lines based on the input data item. To this end, the read/write circuit 320 may include a plurality of page buffers (PB) 322, 324, 326, with each page buffer corresponding to each column (or each bit line) or each column pair (or each bit line pair). According to an embodiment, a plurality of latches may be included in each of the page buffers 322, 324, 326.

The page buffers 322, 324, 326 may be coupled to a data input/output device (e.g., a serialization circuit or a serializer) through a plurality of buses BUS. When each of the page buffers 322, 324, 326 is coupled to the data input/output device through different buses, a delay that may occur in data transmission from the page buffers 322, 324, 326 can be reduced. For example, each page buffer 322, 324, 326 can perform the data transmission without a waiting time.

According to an embodiment, the memory device 150 may receive a write command, write data, and information (e.g., a physical address) regarding a location in which the write data is to be stored. The control circuitry 180 causes the voltage supply circuit 170 to generate a program pulse, a pass voltage, etc., used for a program operation performed in response to a write command, and to generate one or more voltages used for a verification operation performed after the program operation.

When a multi-bit data item is programmed in non-volatile memory cells included in the memory group 330, the error rate might be higher than that when a single-bit data item is stored in the non-volatile memory cells. For example, an error in the non-volatile memory cells may be induced due to cell-to-cell interference (CCI). In order to reduce error in the non-volatile memory cells, a width (deviation) of a threshold voltage distribution corresponding to stored data items between the non-volatile memory cells, should be reduced.

To this end, the memory device 150 can perform an incremental step pulse programming (ISPP) operation to effectively make a narrow threshold voltage distribution of the non-volatile memory cells. In an embodiment, the memory device 150 can use the ISPP operation for multi-step program operations. For example, the memory device 150 may divide a program operation into a Least Significant Bit (LSB) program operation and a Most Significant Bit (MSB) operation according to a predetermined order between the non-volatile memory cells or pages.

Figure 6:
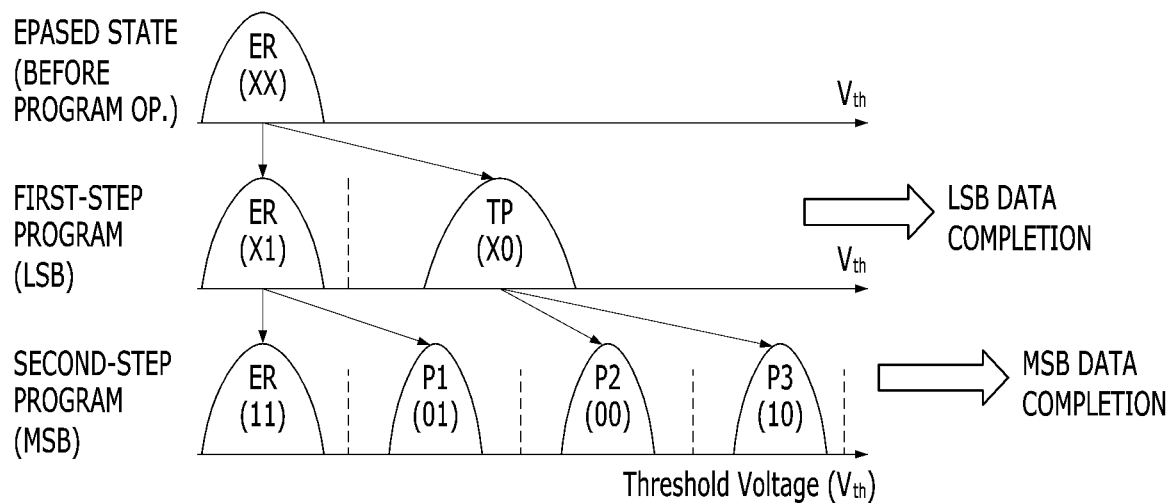
FIG. 6 illustrates a first example of how to program multi-bit data in a memory device according to an embodiment of the present disclosure.

FIG. 6 illustrates a first example of how to program multi-bit data in a memory device in accordance with an embodiment of the present disclosure. Specifically, FIG. 6 illustrates a two-step program operation for storing 2-bit data in a non-volatile memory cell.

Referring to FIG. 6, a non-volatile memory cell can have a threshold voltage of an erased state before a data program operation is performed. When a first-step program operation is performed, LSB data can be programmed into the non-volatile memory cell. Thereafter, when a second-step program operation is performed, MSB data can be programmed into the non-volatile memory cell. Through the first-step program operation and the second-step program operation, the threshold voltage of the non-volatile memory cell becomes one of four different levels ER, P1, P2, P3. Four different threshold voltage levels ER, P1, P2, P3 which the non-volatile memory cell can have can correspond to different 2-bit data of '11', '01', '00', and '10'.

The memory device 150 can take a long time to store multi-bit data. As described with reference to FIG. 1, when the first-step program operation is successfully completed, the memory device 150 can send a completion notice regarding the LSB data (LSB DATA COMPLETION) to the controller 130. Thereafter, the memory device 150 can program the MSB data through the second-step program operation. When the second-step program operation is successfully completed, the memory device 150 can notify the completion regarding MSB data (MSB DATA COMPLETION).

Figure 7:
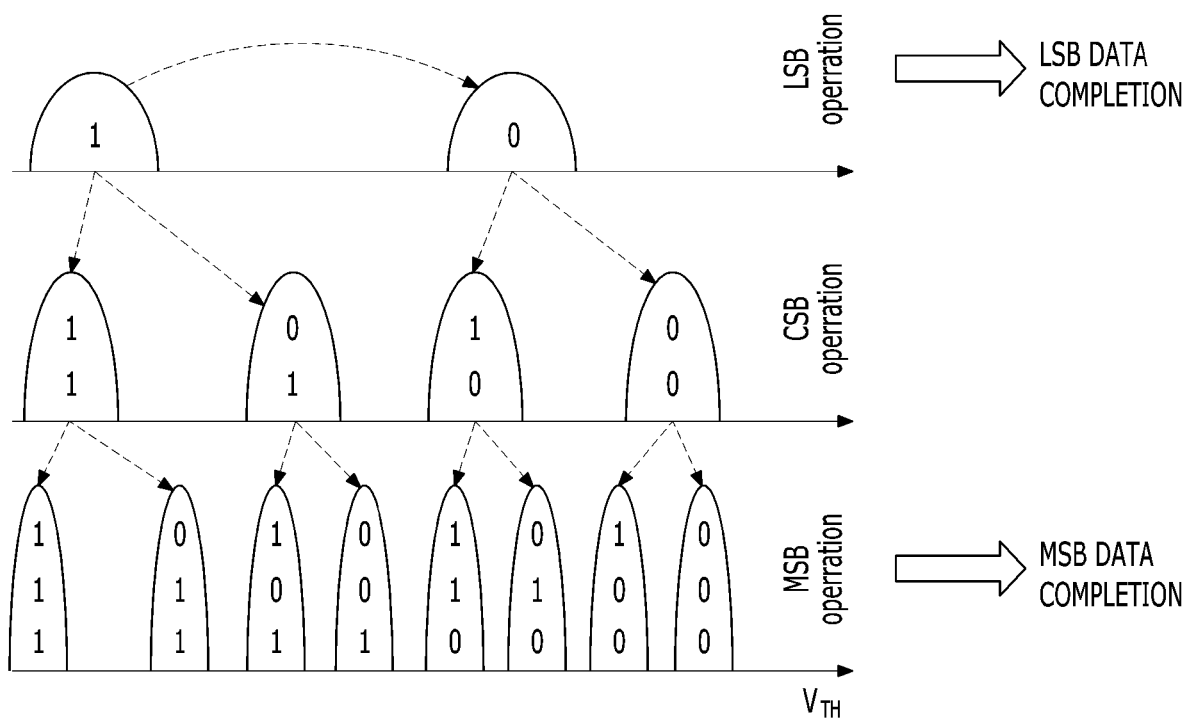
FIG. 7 illustrates a second example of how to program multi-bit data in the memory device according to an embodiment of the present disclosure.

FIG. 7 illustrates a second example of how to program multi-bit data in the memory device in accordance with an embodiment of the present disclosure. Specifically, FIG. 7 illustrates a two-step program operation for storing 3-bit data in a non-volatile memory cell.

Referring to FIG. 7, a non-volatile memory cell can have a threshold voltage of an erased state before a data program operation is performed. When a first-step program operation is performed, LSB data may be programmed into the non-volatile memory cell. Thereafter, when a second-step program operation is performed, CSB data and MSB data can be programmed in the non-volatile memory cell. A threshold voltage of the non-volatile memory cell may have one of eight different levels after the first-step program operation and the second-step program operation are performed. Herein, eight different threshold voltage levels which the non-volatile memory cell can have can indicate three-bit data of '111', '011', '101', '001', '110', '010', '100', and '000'.

The memory device 150 can take a long time to store multi-bit data. As described with reference to FIG. 1, when the first-step program operation is successfully completed, the memory device 150 may notify a completion notice regarding the LSB data (LSB DATA COMPLETION).

Thereafter, the memory device 150 can program the CSB data and the MSB data through a second-step program operation. When the second-step program operation is successfully completed, the memory device 150 can provide a completion notification (MSB DATA COMPLETION) for the CSB data and the MSB data.

Although it has been described in FIG. 7 that 3-bit data can be programmed in the non-volatile memory cell by the two-step program operation, the 3-bit data can be programmed through a three-step program operation according to another embodiment. For example, when programming in the three-step program operation, the memory device 150 may transfer each completion notice regarding each of LSB data, CSB data, and MSB data.

Figure 8:
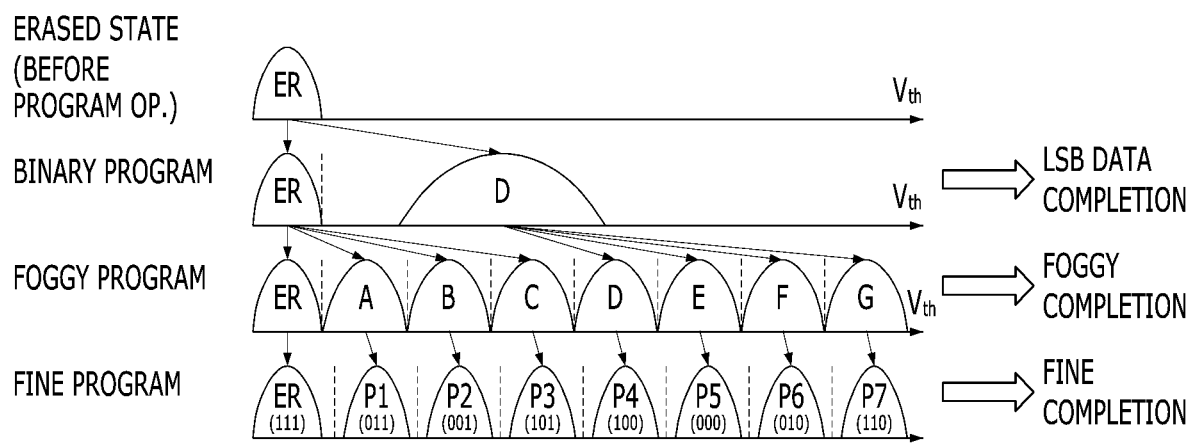
FIG. 8 illustrates a third example of how to program multi-bit data in the memory device according to an embodiment of the present disclosure.

FIG. 8 illustrates a third example of how to program multi-bit data in the memory device in accordance with an embodiment of the present disclosure. Specifically, FIG. 8 illustrates a two-step program operation for storing 3-bit data in a non-volatile memory cell.

Referring to FIG. 8, a non-volatile memory cell can have a threshold voltage of an erased state before a data program operation is performed. The memory device 150 may first perform a partial program operation based on the LSB data to be stored in the non-volatile memory cell. Here, the partial program operation can include a binary programming operation in which a threshold voltage of a nonvolatile memory cell is greatly increased by using a very large ISPP step pulse. After performing the binary programming operation, the memory device 150 can transfer a completion notification (LSB DATA COMPLETION) for the LSB data.

After the binary programming operation is performed, the memory device 150 may program the non-volatile memory cell based on CSB and MSB data again. In this step, the threshold voltage of the non-volatile memory cell can be increased by using an ISPP step pulse smaller than that of the binary programming operation. This process can be referred to as a foggy program operation. Thereafter, the memory device 150 may perform a fine program operation to narrow threshold voltage distributions of non-volatile memory cells. The fine program operation can use smaller ISPP step pulses than that used in a foggy program operation.

Unlike the binary program operation or the foggy program operation, the fine program operation can include a process of narrowing the threshold voltage distributions of the non-volatile memory cells. Accordingly, the possibility of errors can increase during the fine program operation. In an embodiment, the memory device 150 can store the multi-bit data (all bit values), which are to be programmed, in the SLC buffer after the binary program operation and the foggy program operation. For another example, the memory device 150 can notify completion of the foggy program operation after the foggy program operation is performed. Also, the memory device 150 may notify the completion of the fine program operation (FINE COMPLETION) after the fine program is performed.

As described above, referring to FIGS. 6 to 8, a procedure of storing the multi-bit data in the memory device 150 may be performed by a plurality of step program operations. When at least some step program operations of the memory device 150 are successfully completed, a completion notification could be output to the controller 130.

Figure 9:
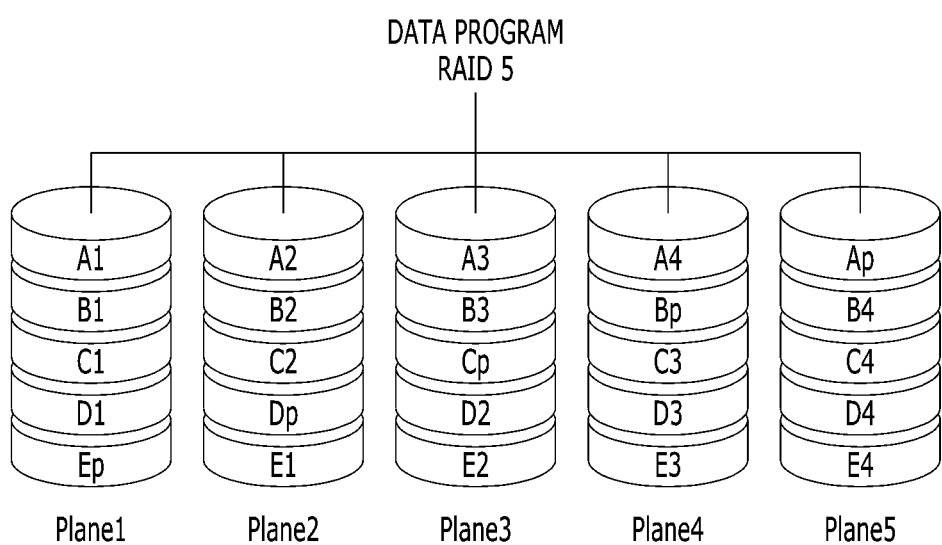
FIG. 9 illustrates a redundant array of independent (or inexpensive) disks (RAID) applicable to a memory device according to an embodiment of the present disclosure.

FIG. 9 illustrates a redundant array of independent (or inexpensive) disks (RAID) applicable to a memory device in accordance with an embodiment of the present disclosure. Specifically, FIG. 9 shows an example of using five regions (Plane1, Plane2, Plane3, Plane4, Plane5) in a Redundant Array of Independent Disk (RAID) or a Redundant Array of Inexpensive Disk (RAID).

Five regions included in the memory device using a RAID scheme can have substantially a same size. According to an embodiment, each of the five regions Plane1, Plane2, Plane3, Plane4, Plane5 included in the memory device 150 can include a memory plane, a memory block, a memory die, or the like. In another embodiment, the five regions Plane1, Plane2, Plane3, Plane4, and Plane5 can be five logical regions established by a user.

The memory system 100 can use the RAID scheme to store 4 pieces of data A1, A2, A3, A4 and 1 parity Ap in five regions Plane1, Plane2, Plane3, Plane4, Plane5. Even if an error occurs in one region of the five regions Plane1, Plane2, Plane3, Plane4, Plane5, data stored in an errored region can be recovered and restored based on the other pieces of data and the parity stored in the remaining four regions. For example, the parity Ap can be generated by an exclusive-OR (XOR) logical operation on the four pieces of data A1, A2, A3, A4. Thereafter, when an error occurs in a second piece of data A2 among the four pieces of data A1, A2, A3, A4, the second data A2 can be recovered and restored by an exclusive-OR (XOR) operation on first, third, and fourth pieces of data A1, A3, A4 and the piece of parity Ap.

In addition, because it is difficult to predict at which region among the five regions Plane1, Plane2, Plane3, Plane4, Plane5 a problem will occur, locations for storing four pieces of data and one piece of parity can be changed. For example, one piece of first parity Ap corresponding to the four pieces of first data A1, A2, A3, A4 can stored in a fifth region Plane5, but one piece of second parity Bp corresponding to four pieces of second data B1, B2, B3, B4 can be stored in a fourth space Plane4.

Referring to FIGS. 1 and 9, in the five regions Plane1, Plane2, Plane3, Plane4, Plane5 of the memory device 150, four pieces of first data A1, A2, A3, A4 and one piece of first parity Ap can be programmed. The parity generation engine 510 described with reference to FIG. 1 may generate one piece of first parity Ap based on the four pieces of first data A1, A2, A3, A4. In the memory system 110, four pieces of first data A1, A2, A3, A4 can be stored in the first non-volatile cell region 522, and one piece of first parity Ap can be stored in the second non-volatile cell region 524. In order to program the multi-bit data, when the memory device 150 according to an embodiment of the present disclosure can perform a two-step program operation, a parity can be generated and stored in the RAID scheme. In this case, the size of the SLC buffer described with reference to FIG. 9 or the second non-volatile cell region 524 described with reference to FIG. 1 can be reduced or used efficiently.

Figure 10:
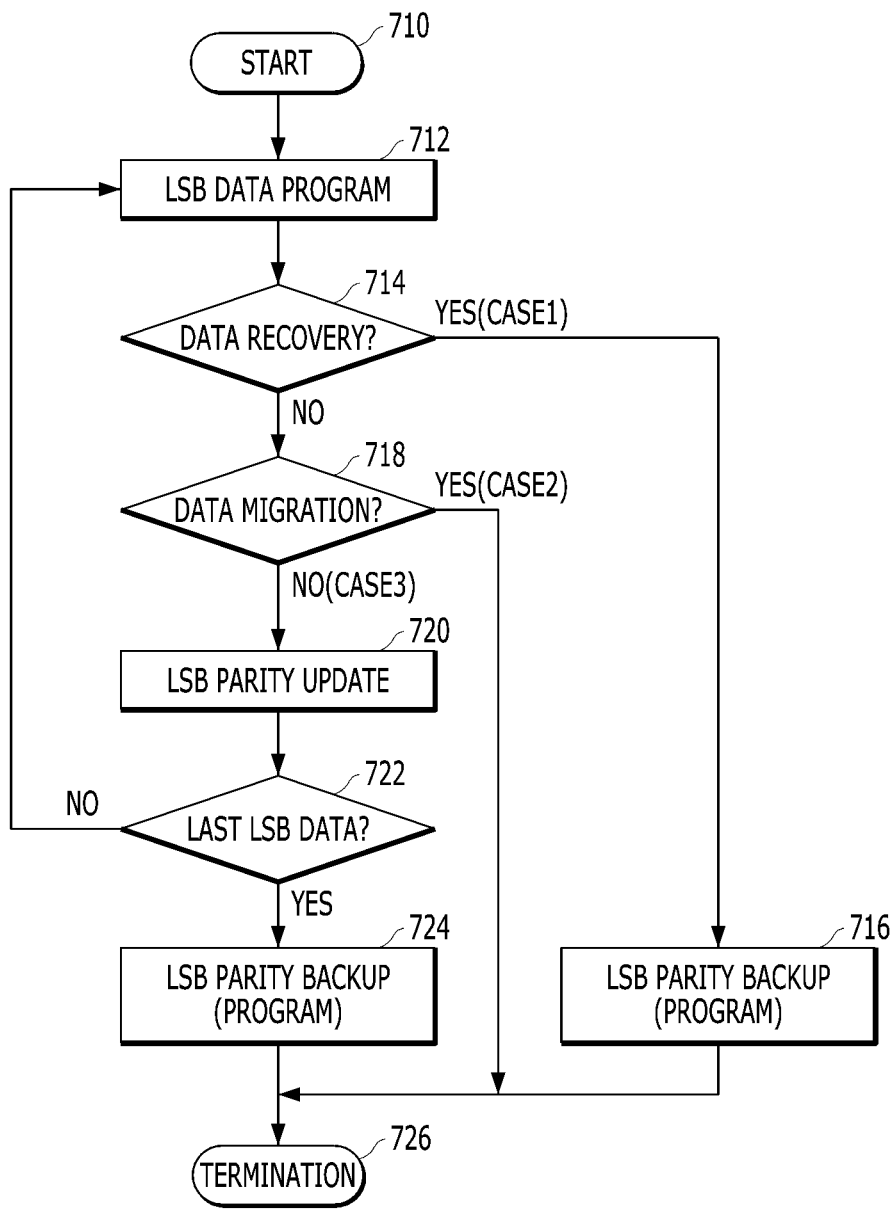
FIG. 10 illustrates a data program method according to an embodiment of the present disclosure.

FIG. 10 illustrates a data program method according to an embodiment of the present disclosure.

Referring to FIG. 10, when a data program operation starts (operation 710), the memory device 150 can program LSB data in a non-volatile memory cell (operation 712). After the memory device 150 programs LSB data in the non-volatile memory cell (operation 712), the memory device 150 can determine whether data restoration is performed to recover or restore LSB data programmed in the non-volatile memory cell due to an error or an interrupt (e.g., Sudden Power Off SPO or Sudden Power Off Recovery SPOR) (operation 714). If the data restoration operation is performed for data recovery of the LSB data programmed in the non-volatile memory cell due to an error or an interrupt (e.g., Sudden Power Off SPO) based on data which has been programmed in the memory device 150 (e.g., YES in the operation 714), the memory device 150 can back up the LSB data stored in the non-volatile memory cell (operation 716). An example of the operation 716 of backing up the LSB data will be described later with reference to FIG. 11.

Moreover, if data recovery due to an error or an interrupt (e.g., Sudden Power Off, SPO) is not performed in response to data programmed in the memory device 150 (NO in the operation 714), the memory device 150 can check whether program data is copied, moved, or migrated within the memory system 110 (operation 718). Here, data migration within the memory system 110 is a process of copying, moving, or migrating data from one location to another location in the memory system 110 due to garbage collection or wear leveling. If the program data is associated with the data migration in the memory system 110 (YES in the operation 718), the memory device 150 might not perform a backup operation or generate a parity for LSB data which has been already programmed in the memory device 150.

On the other hand, if the program operation is not performed for recovery for the LSB data or data migration (NO in the operation 718), the parity generation engine 510 can update or calculate parity information based on the LSB data which is programmed (operation 720). After the parity generation engine 510 updates the parity information (operation 720), the memory device 150 can check whether the programmed LSB data is the last LSB data (operation 722). If the LSB data program operation is not for data recovery or data migration, the program data can be data transferred from the host 102, which is an external device, in order to store the program data within the memory system 110. If the step programmed LSB data is the last LSB data (YES in the operation 722), the parity information generated by the parity generation engine 510 can be stored. An operation of backing up the parity associated with the LSB data will be described later with reference to FIG. 12. If the programmed LSB data is not the last LSB data (NO in the operation 722), the memory device 150 can program the next LSB data (operation 712).

Referring to FIG. 10, when data programmed in a non-volatile memory cell is LSB data, the memory device 150 or the parity generation engine 510 can back up the LSB data (operation 716) in a first case (CASE1), back up the parity information regarding the LSB data (operation 724) (CASE3), or may not perform the backup operation (CASE2).

Figure 11:
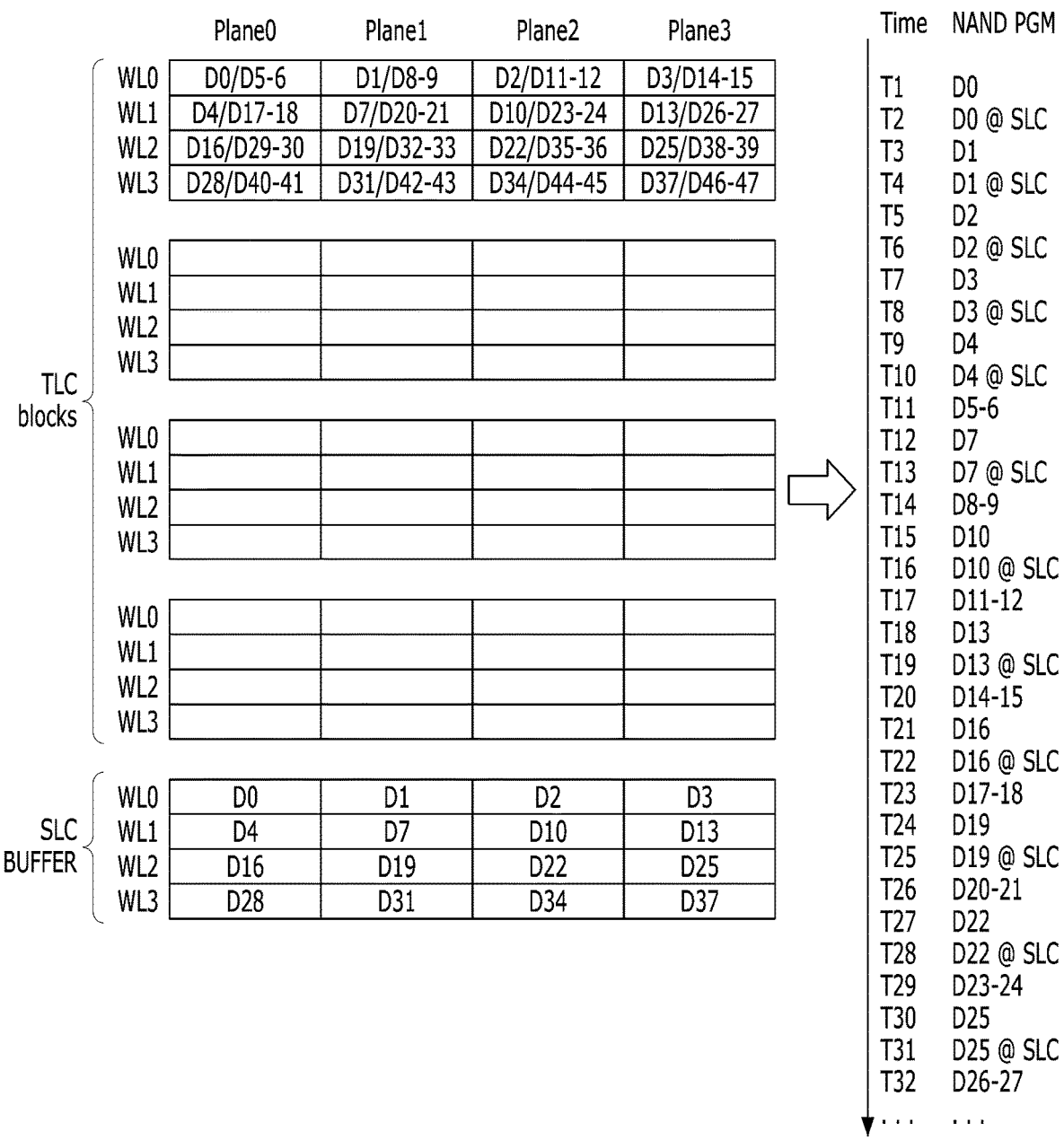
FIG. 11 illustrates a first example of the data program method according to an embodiment of the present disclosure.

FIG. 11 illustrates a first example of the data program method in accordance with an embodiment of the present disclosure. FIG. 11 can describe a detailed operation of the first case (CASE1) of backing up the LSB data (operation 716) described in FIG. 10. Specifically, FIG. 9 describes an operation of programming multi-bit data (3-bit data) in a memory device including a plurality of memory planes Plane0, Plane1, Plane2, Plane3. The plurality of memory planes Plane0, Plane1, Plane2, Plane3 are shown as an example to describe a region in which the multi-bit data is programmed. The multi-bit data can be stored in a plurality of memory blocks or a plurality of memory dies in a substantially same way. According to an embodiment, the memory device 150 may sequentially store the multi-bit data in a plurality of regions, e.g., a preset number of strings or a plurality of subpages, within a single memory block.

Referring to FIG. 11, the first plane Plane0 can include a plurality of TLC blocks and at least one SLC buffer. Herein, the TLC block can include a plurality of memory cells connected to the plurality of word lines WL0, WL1, WL2, WL3. Data corresponding to a plurality of pages may be stored in a plurality of non-volatile memory cells connected to each of the word lines WL0, WL1, WL2, WL3 in the TLC block. That is, the multi-bit data can be stored in each non-volatile memory cell. For example, in non-volatile memory cells connected to a first word line WL0 of the first block TLC Block in the first plane Plane0, first data D0, sixth data D5, and seventh data D6, which correspond to LSB page data, CSB page data, and MSB page data, can be programmed. In non-volatile memory cells connected to a second word line WL1 of the first block TLC Block in the first plane Plane0, fifth data D4, $18^{th}$ data D17, and $19^{th}$ data D18, which correspond to LSB page data, CSB page data, and MSB page data, can be programmed.

Further, the SLC buffer may include a plurality of non-volatile memory cells connected to the plurality of word lines WL0, WL1, WL2, WL3. Data corresponding to one page may be stored in a plurality of non-volatile memory cells connected to each of the word lines WL0, WL1, WL2, WL3 in the SLC block. For example, the first data D0 can be stored in non-volatile memory cells connected to the first word line WL0 of the first SLC buffer in the first plane Plane0.

Referring to FIGS. 7 to 8, the operation of storing the multi-bit data in a plurality of TLC blocks can be performed through a multi-step operation. Referring to FIG. 7, when a first step program operation for storing LSB data is completed during a data program operation for multi-bit data in a plurality of TLC blocks included in a plurality of planes Plane0, Plane1, Planet, Plane3, the memory device 150 can transfer a completion notification for the LSB data. Because an error or an interrupt can occur while the second step program operation is being performed, the LSB data stored in the plurality of TLC blocks can be backed up to the SLC buffer when the first step program operation is performed, to increase data safety.

For example, at a first time point T1, first data D0 is first programmed as LSB data in non-volatile memory cells connected to the first word line WL0 of the first block TLC Block of the first plane Plane0. After being programmed, the first data D0 can be backed up to the first word line WL0 of the SLC buffer of the first plane Plane0 at a second time point T2. After the second data D1 is programmed as LSB data in non-volatile memory cells connected to the first word line WL0 of the first block TLC Block of the second plane Plane1 at a third time point T3, the second data D1 can be backed up in non-volatile memory cells coupled to the first word line WL0 of the SLC buffer of the second plane Plane1 at a fourth time point T4. When third data D2 is programmed as LSB data in non-volatile memory cells connected to the first word line WL0 of the first block TLC Block of the third plane Plane2 at a fifth time point T5, the third data D2 can be programmed as the LSB data. At a sixth time point T6, the third data D2 may be backed up in non-volatile memory cells coupled to the first word line WL0 of the SLC buffer of the third plane Plane2. Similarly, fourth data D3 is programmed as LSB data in non-volatile memory cell connected to the first word line WL0 of the first block TLC Block of the fourth plane Plane3 at a seventh time point T7. At the eighth time point T8, the fourth data D3 can be backed up in non-volatile memory cells coupled to the first word line WL0 of the SLC buffer of the third plane Plane3.

After the LSB data is programmed in non-volatile memory cells coupled to the first word line WL0, the memory device 150 can program other LSB data in non-volatile memory cells connected to the second word line WL1 adjacent to the first word line WL0. After performing the first step program operation with the LSB data in the non-volatile memory cells connected to the second word line WL1, the memory device 150 can perform a second step program operation for CSB data and MSB data in the non-volatile memory cells connected to the first word line WL1. Through this program procedure, the fifth data D4 at the ninth time point T9 is programmed as LSB data in the non-volatile memory cells connected to the second word line WL1 of the first block TLC Block in the first plane Plane0. The fifth data D4 can be backed up to the second word line WL0 of the SLC buffer in the first plane Plane0 at the tenth time point T10. Thereafter, at an eleventh time point T11, the sixth data D5 and the seventh data D6 can be programmed as CSB data and MSB data in the non-volatile memory cells connected to the first word line WL0.

Moreover, the memory device 150 can program the sixth data D5 and the seventh data D6 as CSB data and MSB data in the first block TLC block, but the sixth data D5 and the seventh data D6 might not be backed up in the SLC buffer. Because the 3-bit data, i.e., LSB data, CSB data, and MSB data, are completely programmed in the non-volatile memory cells connected to the first word line WL0 of the first block TLC Block of the first plane Plane0, the memory device 150 does not have to back up the sixth data D5 and the seventh data D6 in the SLC buffer, and the backed-up first data D0 may become unnecessary.

In the data program operation for programming the multi-bit data described with reference to FIG. 11, the memory device 150 can perform the first step program operation regarding the LSB data in the first block (TLC Block) included in the plurality of planes Plane0, Plane1, Planet, Plane3. Then, the memory device 150 can send a completion notification and back up the LSB data in the SLC buffer. Thereafter, even if an error or an interrupt occurs in a process of programming CSB data or MSB data through the second step program operation, the LSB data for which the completion notification is sent could be restored or recovered because the LSB data has been backed up. The first block TLC block described in FIG. 11 can correspond to the first non-volatile cell region 522 described in FIG. 1, and the SLC block described in FIG. 11 can correspond to the second non-volatile cell region 524 described in FIG. 1.

Even if an error or an interrupt occurs at a specific point in the data program operation performed in the memory device 150, the memory system 110 can perform an operation for restoring or recovering LSB data. When an error or an interrupt occurs at a specific point in time, it is necessary for the memory device 150 to provide safety for data associated with a completion notification before the error or the interrupt occurs. In FIG. 11, because the LSB data stored in the first block (TLC Block) is backed up in the SLC block, the memory system 110 can provide data safety of the backed-up data.

Figure 12:
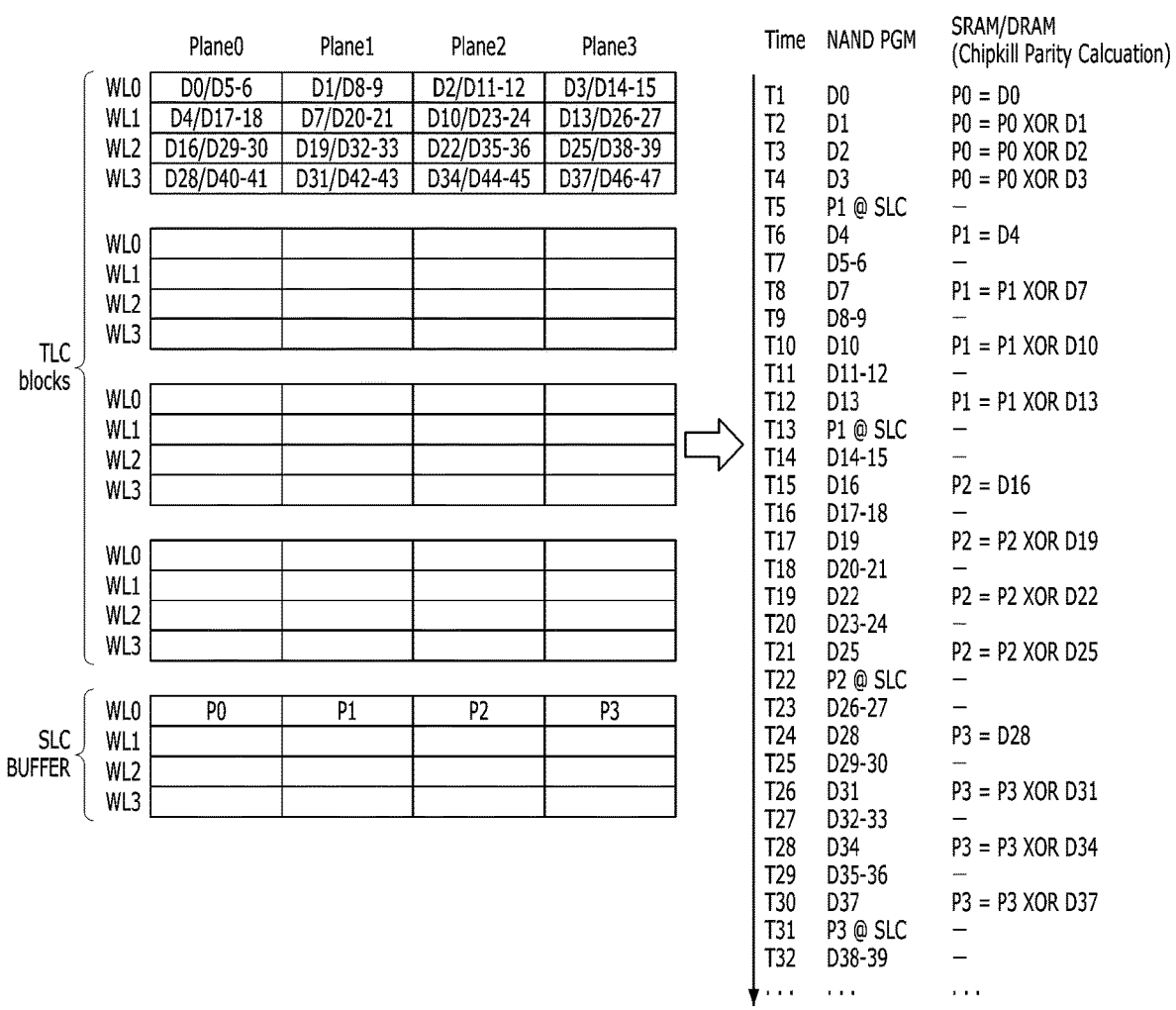
FIG. 12 illustrates a second example of the data program method according to an embodiment of the present disclosure.

FIG. 12 illustrates a second example of the data program method in accordance with an embodiment of the present disclosure. FIG. 12 describes a detailed operation (operation 724) of backing up a parity associated with LSB data described in FIG. 10 (CASE3). Specifically, FIG. 12 describes an operation of programming the multi-bit data (3-bit data) in a memory device including a plurality of memory planes Plane0, Plane1, Plane2, Plane3. The plurality of memory planes Plane0, Plane1, Plane2, Plane3 are shown as an example to describe plural regions in which the multi-bit data is stored. The multi-bit data can be programmed in a plurality of memory blocks or a plurality of memory dies in substantially the same way.

Referring to FIG. 12, the first plane Plane0 can include a plurality of TLC blocks and at least one SLC buffer. The TLC block may include a plurality of non-volatile memory cells coupled to the plurality of word lines WL0, WL1, WL2, WL3. Data corresponding to a plurality of pages may be stored in a plurality of memory cells coupled to each of the word lines WL0, WL1, WL2, WL3 in the TLC block. A program order of data stored in the TLC block shown in FIG. 12 is substantially the same as the program order of data stored in the TLC block described in FIG. 11.

The SLC buffer can include a plurality of non-volatile memory cells connected to a plurality of word lines WL0, WL1, WL2, WL3. Unlike the embodiment described with reference to FIG. 11, the plurality of non-volatile memory cells connected to each word line WL0, WL1, WL2, WL3 in the SLC block described with reference to FIG. 12 can store parity information P0, P1, P2, P3, each parity information corresponding to LSB data programmed in each page of the TLC blocks in the plurality of memory planes Plane0, Plane1, Plane2, Plane3. For example, the parity generation engine 510 can generate the first parity information P0 based on the first data to the fourth data D0, D1, D2, D3. The first parity information P0 can be stored in the SLC buffer. While the first to fourth data D0, D1, D2, D3 are sequentially programmed in the RAID scheme described with reference to FIG. 9, the parity generating engine 510 can generate the first parity information P0 by performing an exclusive-OR (XOR) operation on the LSB data programmed in the TLC blocks.

Referring to FIGS. 7 to 8, the operation of storing a plurality of multi-bit data in a plurality of TLC blocks can be performed in multiple steps. Referring to FIG. 7, when the first step program operation for storing LSB data is completed during the data program operation for storing the plurality of multi-bit data in the plurality of TLC blocks in a plurality of memory planes Plane0, Plane1, Planet, Plane3, the memory device 150 can output a completion notification for the LSB data. As described in FIG. 10, if the memory system 110 transfers a completion notification regarding at least some among program data transmitted from the host 102, which is an external device, the memory system 110 should ensure safety of the data associated with the completion notification. Because an error or an interrupt may occur when the second step program operation is performed in the non-volatile memory cells of storing the LSB data, the first parity information P0 for the LSB data stored in the plurality of TLC blocks can be backed up in the SLC buffer after the first step program operation is performed.

For example, at a first time point T1 when the memory device 150 can program first data D0 as LSB data in non-volatile memory cells coupled to the first word line WL0 in the first TLC block of the first memory plane Plane0, the parity generation engine 510 can determine the first data D0 as first parity information P0 (P0=D0). At a second time point T2 when the memory device 150 programs second data D1 as LSB data in non-volatile memory cells coupled to the first word line WL0 of the first block TLC Block of the second plane Plane1, the parity generation engine 510 can perform an exclusive OR (XOR) operation to the second data D1 and the previous first parity information (P0=D0) to update the first parity information P0 (P0=P0 XOR D1=D0 XOR D1). When the memory device 150 programs third data D2 as LSB data in non-volatile memory cells connected to the first word line WL0 of the first block TLC Block of the third plane Planet at the third time point T3, the parity generation engine 510 can perform an exclusive OR (XOR) operation to the third data D2 and the previous first parity information to update the first parity information P0 (P0=P0 XOR D2=(D0 XOR D1) XOR D2). Afterwards, at a fourth time point T4 when the memory device 150 can program fourth data D3 as LSB data in the non-volatile memory cells coupled to the first word line WL0 of the first block TLC Block of the fourth plane Plane3, the parity generation engine 510 can perform an exclusive OR (XOR) operation to the fourth data D3 and the previous first parity information (P0=(D0 XOR D1) XOR D2) to update the parity information P0 (P0=P0 XOR D3=((D0 XOR D1) XOR D2) XOR D3).

The memory device 150 can program the first data D0 to the fourth data D3 in non-volatile memory cells coupled to a first word line WL0 of each of the TLC blocks in the plurality of memory planes Plane0, Plane1, Planet, Plane3. After program operations for the LSB data, the parity generation engine 510 can generate the first parity information (P0=((D0 XOR D1) XOR D2) XOR D3) associated with the first data D0 to the fourth data D3. The memory device 150 can store the first parity information P0 in non-volatile memory cells coupled to the first word line WL0 of the SLC buffer in the first plane Plane0.

After the LSB data for the first word line WL0 is programmed, the memory device 150 can program other LSB data in non-volatile memory cells coupled to the second word line WL1 adjacent to the first word line WL0. After performing a first step program operation for programming the LSB data in the non-volatile memory cells connected to the second word line WL1, the memory device 150 can perform a second step program operation for programming the CSB data and MSB data in the non-volatile memory cell coupled to the first word line WL1.

Through this program sequence, at a sixth time point T6 when the fifth data D4 is programmed as LSB data in the non-volatile memory cells coupled to the second word line WL1 of the first block TLC Block in the first plane Plane0, the second parity information P1 can be determined as the fifth data D4 (P1=D4). At a seventh time point T7, the memory device 150 can program the sixth data D5 and the seventh data D6 as CSB data and MSB data in the non-volatile memory cells connected to the first word line WL0 of the TLC block in the first plane Plane0. While the memory device 150 programs the sixth data D5 and the seventh data D6 as the CSB data and the MSB data in the first block TLC block, the sixth data D5 and the seventh data D6 might not be backed up in the SLC buffer. Because the 3-bit data corresponding to LSB data, CSB data, and MSB data are completely programmed in the non-volatile memory cells coupled to the first word line WL0 of the first block TLC Block of the first plane Plane0, the memory device 150 might not have to back up parity information for the sixth data D5 and the seventh data D6 to the SLC buffer.

Thereafter, at an eighth time point T8 when the memory device 150 programs eighth data D7 as LSB data in the non-volatile memory cells coupled to the second word line WL1 of the first block TLC Block in the second plane Plane1, the second parity information P1 (P1=P1 XOR D7=D4 XOR D7) can be updated as a result of the exclusive OR of the eighth data D7 and the previous second parity information (P1=D4). At a ninth time point T9, the memory device 150 programs the sixth data D5 and the seventh data D6 as CSB data and MSB data in the non-volatile memory cells coupled to the first word line WL0 of the TLC block in the second plane Plane1.

The data program operation described in FIG. 12 is performed on LSB data corresponding to the first step program operation during a procedure of programming multi-bit data in the first TLC blocks included in the plurality of memory planes Plane0, Plane1, Planet, Plane3. While notifying program completion, the memory system 110 can back up the parity information for the LSB data in the SLC buffer. Thereafter, even if an error or an interrupt occurs in programming CSB data or MSB data through the second step program operation, the LSB data associated with the completion notification can be recovered and restored because the LSB data and the parity information are backed up. For example, referring to FIG. 9, even if an error occurs in one of the first data to the fourth data D1, D2, D3, D4, data in which the error occurred can be recovered and restored based on the first data to the fourth data D1, D2, D3, D4 and the first parity information P0. The first block TLC block described in FIG. 12 can correspond to the first non-volatile cell region 522 described in FIG. 1, and the SLC block described in FIG. 12 can correspond to the second non-volatile cell region 524 described in FIG. 1.

Figure 13:
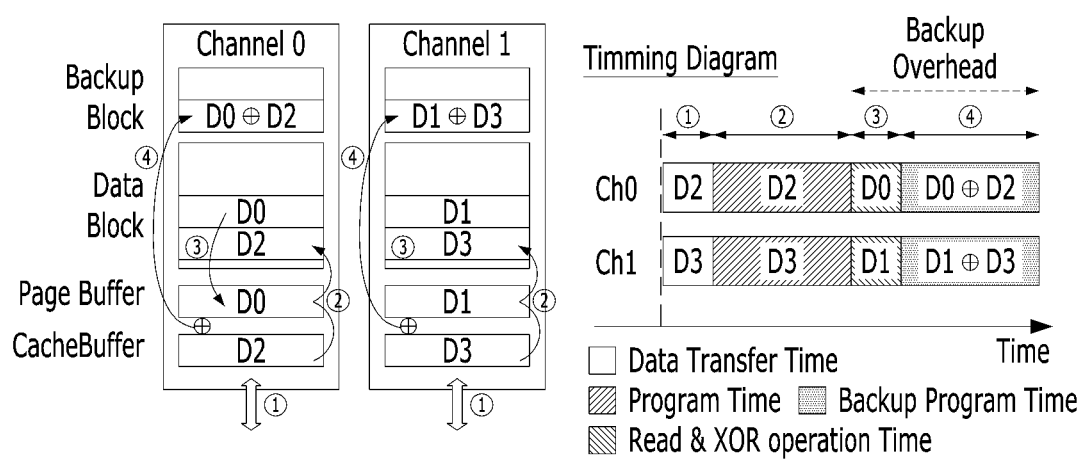
FIG. 13 illustrates data transfer between a controller and a memory device during a data program operation according to an embodiment of the present disclosure.

FIG. 13 illustrates data transfer between a controller and a memory device during a data program operation in accordance with an embodiment of the present disclosure. Specifically, the operation of generating and backing up the parity information described with reference to FIG. 12 can be performed by the controller 130 and the memory device 150 described with reference to FIGS. 2 to 3. FIG. 13 is a diagram illustrating data transmission and a time spent on the data transmission via first and second channels Ch0, Ch1 connecting the controller 130 and the memory device 150 during a program operation and an operation performed in the memory device 150.

Referring to FIG. 13, first data D0 is stored in a memory block connected to the controller 130 through a first channel Ch0, and second data D1 can be programmed in a memory block connected through a second channel Ch1. The controller 130 transmits third data D2 to a memory block through the first channel Ch0 and transmits fourth data D3 to a memory block through the second channel Ch0. According to another embodiment, the memory blocks connected to the controller 130 through the first channel Ch0 or the second channel Ch1 can be included in different memory chips, different memory dies, or different memory planes, individually.

The controller 130 is configured to transfer the third data D2 and the fourth data D3 through the first channel Ch0 and the second channel Ch1 in parallel into the memory device 150 including data blocks at positions in which the third data D2 and the fourth data D3 are stored (①). After the third data D2 and the fourth data D3 are stored in the cache buffer included in the memory device 150, the memory device 150 can transfer the third data D2 and the fourth data D3 from the cache buffer to the page buffer. Then, the third data D2 and the fourth data D3 in the page buffer can be programmed into the memory block (②). The memory device 150 can read and store the first data D0 and the second data D1 in the page buffer, and then perform an XOR operation on the first data D0 and the second data D1 and the third data D2 and the fourth data D3, which are stored in the cache buffer (③). The memory device 150 may program an XOR result D0D2, D1D3 in the backup block (④). In the above process, a time spent on reading the already programmed data and performing the exclusive-OR operation (③) and a time spent on programming the result of the exclusive-OR operations (④) may be overheads for generating and backing up parity information.

When the above-described overheads occur with respect to data transferred and programmed within the memory device 150, data input/output performance of the memory device 150 might be reduced or degraded. According to an embodiment, the memory device 150 applies a RAID scheme to store parity information while programming a preset number of data as described with reference to FIG. 12. After the preset number of data is programmed, updated parity information regarding the preset number of data could be programmed at a different location. The memory device 150 might reduce an amount of parity information and reduce overheads. In addition, to reduce a time for reading data previously stored in the memory block and storing read data in the page buffer, the memory device 150 can include a separate storage space for calculating or updating parity information in the page buffer or the cache buffer according to an embodiment of the present disclosure.

Figure 14:
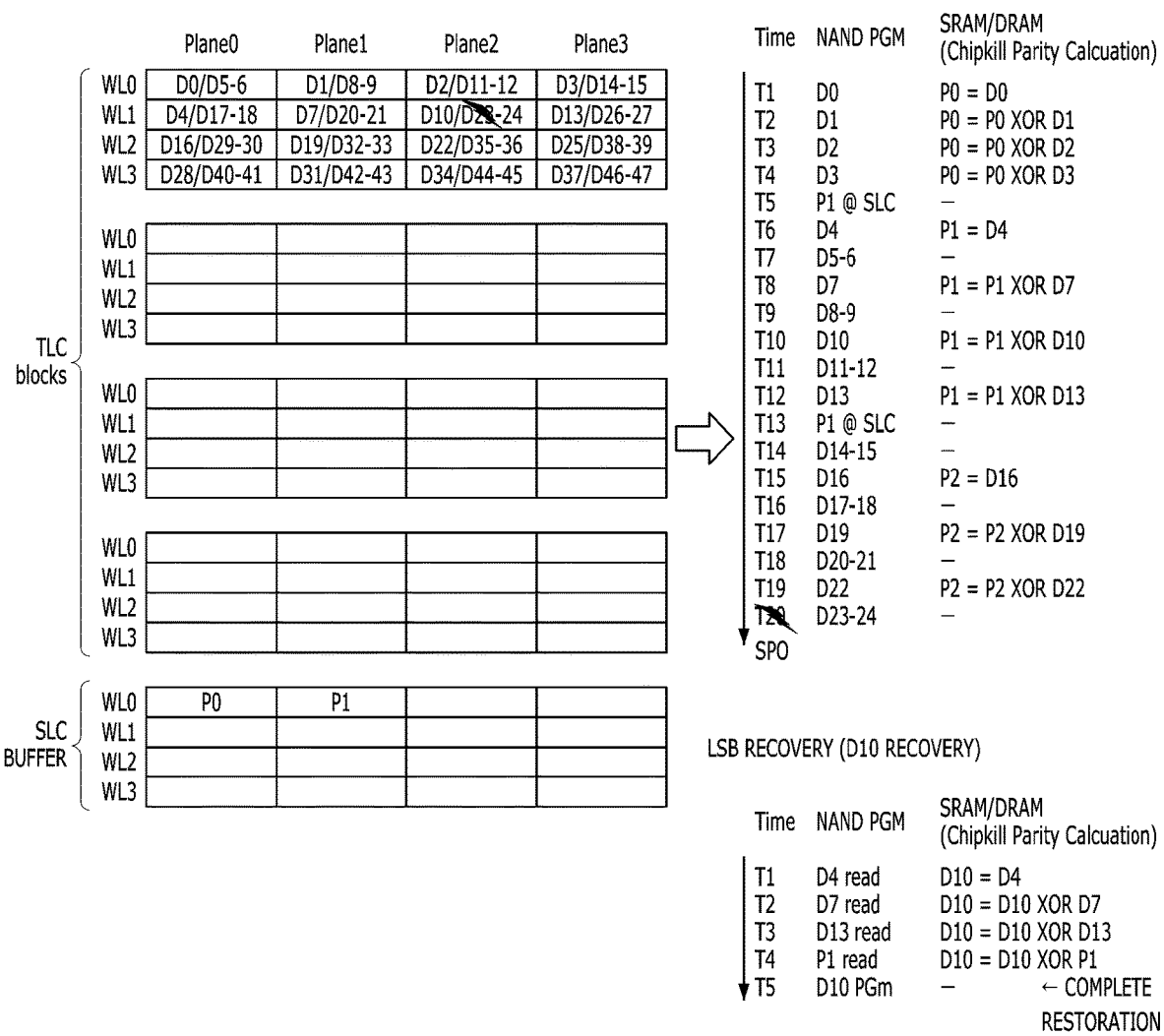
FIG. 14 illustrates a case in which the data program operation is stopped or halted in a memory system according to an embodiment of the present disclosure.

FIG. 14 illustrates a case in which the data program operation is stopped or halted in a memory system in accordance with an embodiment of the present disclosure. The data program operation described with reference to FIG. 14 is substantially the same as the data program operation described with reference to FIG. 12. However, in FIG. 14, a sudden power off occurs at a twentieth time point T20 when the memory device 150 stores the 24$^{th}$ data D23 and the 25$^{th}$ data D24 in the third plane Planet. FIG. 14 illustrates an example of a programming operation with CSB data and MSB data in non-volatile memory cells connected to the second word line WL1 of the TLC block, which has failed.

Because the program operations performed from the first time point T1 to the 19$^{th}$ time point T19 are successfully completed, the memory device 150 might guarantee data safety from the first data D0 to the 23$^{rd}$ data D22. However, at the twentieth time point T20, the operation for programming the twenty-fourth data D23 and the twenty-fifth data D24 as the CSB data and the MSB data fails, so that the eleventh LSB data stored in the non-volatile memory cells of the same location and the safety of the LSB data D10 might be questionable.

When power is resumed after the sudden power off, the memory system 110 or the memory device 150 can recover the eleventh data D10 whose safety is suspected. At a first time point T1 after power is supplied, the memory device 150 reads the fifth data D4 associated with the eleventh data D10 from the TLC block, and then saves the fifth data D4 as the eleventh data D10 (D10=D4). Thereafter, at a second time point T2, the memory device 150 reads the eighth data D7 associated with the eleventh data D10 from the TLC block to perform an exclusive OR operation on the eighth data D7 and the fifth data D4 stored as the eleventh data D10. After performing the XOR operation, the result may be updated as the eleventh data D10 (D10=D10 XOR D7=D4 XOR D7). At a third time point T3, the memory device 150 reads the 14$^{th}$ data D13 associated with the 11$^{th}$ data D10 from the TLC block and performs an exclusive OR (XOR) operation with the previous 11th data D10. The result may be updated as the eleventh data D10 (D10=D10 XOR D13=(D4 XOR D7) XOR D13). At a fourth time point, the memory device 150 reads the second parity information P1 associated with the eleventh data D10 from the SLC buffer, performs an exclusive OR (XOR) operation with the previous eleventh data D10. Then, the result can be updated as the eleventh data D10 (D10=D10 XOR P1=((D4 XOR D7) XOR D13) XOR P1). At a fifth time point T5, the memory device 150 can program the restored eleventh data D10 in the TLC block to recover data whose data safety is suspected due to a sudden power off. As described above, even if a program operation fails at a specific point in time, the memory system 110 can guarantee the safety of data programmed in the memory device 150 before the corresponding point in time.

Figure 15:
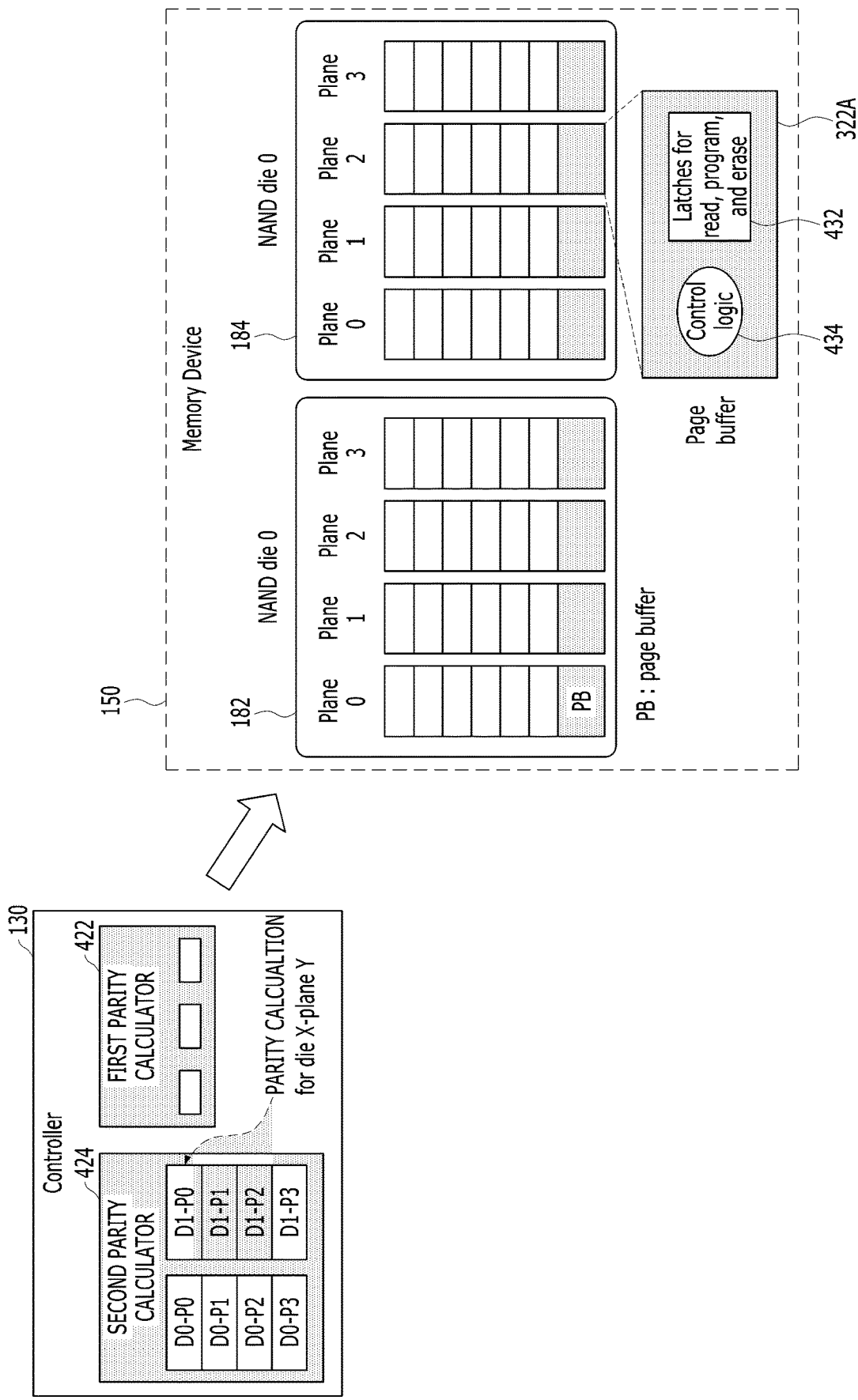
FIG. 15 illustrates a first example of an apparatus for controlling a data program operation according to an embodiment of the present disclosure.

FIG. 15 illustrates a first example of an apparatus for controlling a data program operation in accordance with an embodiment of the present disclosure.

Referring to FIG. 15, the controller 130 in the memory system 110 can include a module or a circuit 424, 422 configured to calculate parity for restoring or recovering data which has been stored or being programmed in the memory device 150. The memory device 150 may include a plurality of memory dies 182, 184.

The memory dies 182, 184 may include a plurality of memory planes Plane0, Plane1, Planet, Plane3. Each memory plane can include a plurality of memory blocks and page buffers PB. The page buffers 322A can include a control circuit 434 for controlling data input/output operations and a plurality of latches 432.

According to an embodiment, the first parity calculator 422 and the second parity calculator 424 included in the controller 130 can perform different operations. The first parity calculating unit 422 may correspond to the error correction circuitry 138 described with reference to FIG. 2. The first parity calculator 422 can encode data using an error collection code to recover data when an error occurs in data programmed in the memory device 150 or an error occurs in some non-volatile memory cells in the memory device 150. Further, the first parity calculator 422 can decode data using an error collection code to check whether there is an error in data read from the memory device 150.

Unlike the first parity calculator 422, the second parity calculator 424 can generate parity information to secure the safety of already programmed data when data cannot be programmed due to an error or an interrupt during an operation of programming data in the memory device 150. Specifically, the second parity calculator 424 can generate parity information for a plurality of LSB data and transmit the parity information to the memory device 150. As described with reference to FIG. 12, the second parity calculator 424 can generate the parity information by performing an exclusive-OR (XOR) operation on four pieces of data programmed in different regions of the memory device 150.

Because the second parity calculator 424 in the controller 130 can generate parity information for a plurality of LSB data and transmits the parity information to the memory device 150, overhead might be reduced in a process of programming the plurality of LSB data in the memory device 150. In addition, the plurality of memory dies 182, 184 in the memory device 150 can include a logic circuit for generating parity information and a separate storage location (e.g., an additional latch, register, or etc.) for temporarily storing the parity information. However, because the parity information for a plurality of LSB data is transmitted through a channel between the controller 130 and the plurality of memory dies 182, 184, channel occupancy might increase.

Moreover, because the second parity calculator 424 in the controller 130 generates parity information for a plurality of LSB data and transmits the parity information to the memory device 150, the parity information could be programmed in a different die or a different memory plane. For example, the controller 130 may transmit a plurality of LSB data and parity information corresponding to the plurality of LSB data to different memory dies or different planes in the memory device 150. Referring to FIG. 10, as the controller 130 transmits and programs a plurality of LSB data and parity information corresponding to the plurality of LSB data to different regions, safety and reliability of stored data might be improved.

Figure 16:
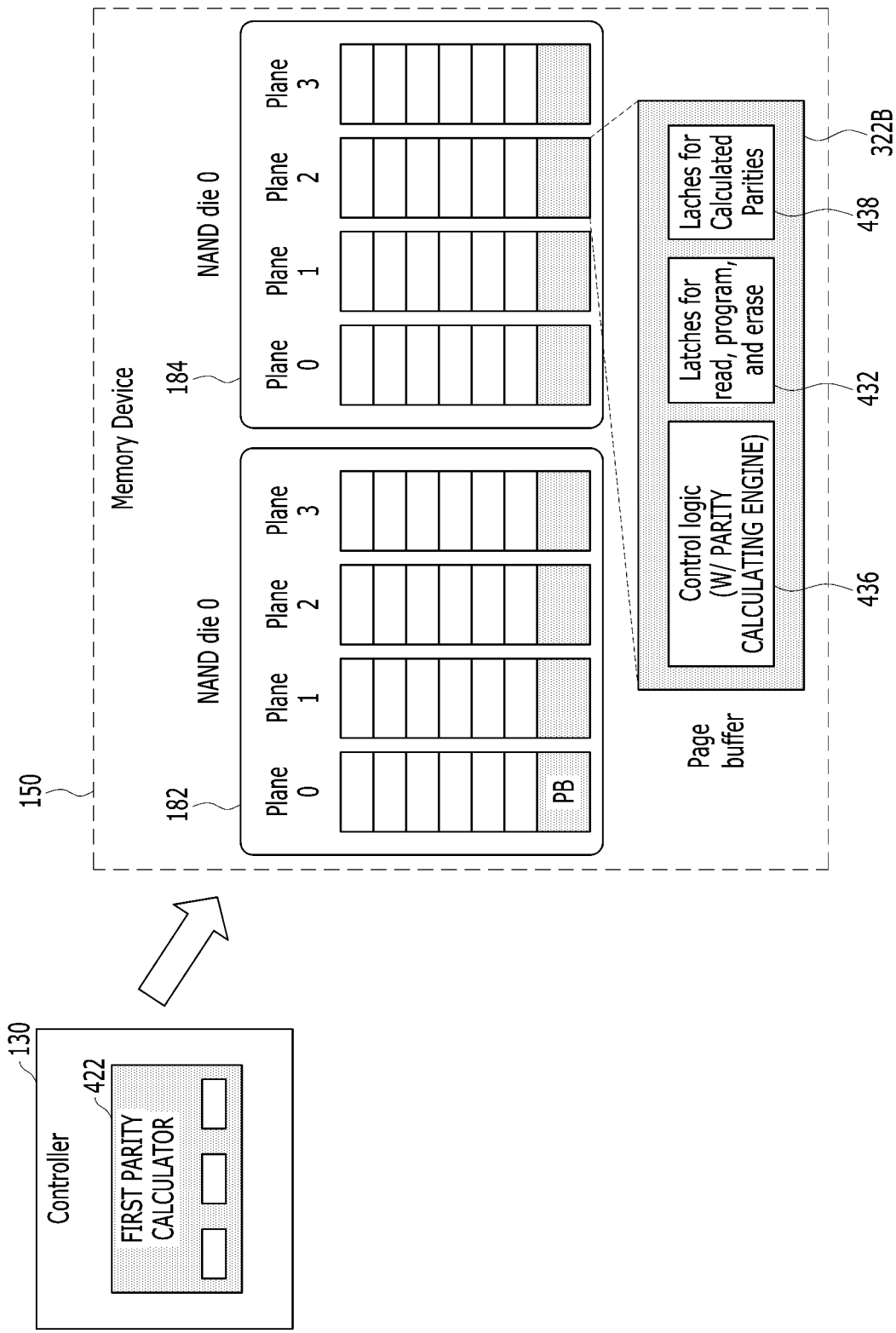
FIG. 16 illustrates a second example of the apparatus for controlling a data program operation according to an embodiment of the present disclosure.

FIG. 16 illustrates a second example of the apparatus for controlling a data program operation in accordance with an embodiment of the present disclosure.

Referring to FIG. 16, the controller 130 in the memory system 110 can include a first parity calculator 422 for calculating a code or a parity for recovering or restoring data stored in the memory device 150. The first parity calculator 422 can correspond to the error correction circuitry 138 described with reference to FIG. 2.

The memory device 150 connected to the controller 130 through a channel may include a plurality of memory dies 182, 184. Each of the memory dies 182, 184 may include a plurality of memory planes Plane0, Plane1, Plane2, Plane3. Each memory plane may include a plurality of memory blocks and a page buffer (PB). The page buffer PB can include a control logic for controlling data input/output operations and a plurality of latches for temporarily storing data transferred during data input/output operations, e.g., read, program, and erase operations. Furthermore, the memory plane or page buffer PB may include a control logic 436 with a parity calculating engine, which corresponds to the second parity calculator 424 shown in FIG. 15, configured to calculate a parity for recovering or restoring data stored through a program operation. According to an embodiment, the parity calculating engine can be included in each of the memory dies 182, 184 or each of the planes Plane0, Plane1, Plane2, Plane3. In another embodiment, the parity calculating engine can be included in each memory die 182, 184.

When the controller 130 transmits data to the memory device 150 through the channel, the control circuit 436 included in the memory device 150, that is, the page buffer 322A included in the memory die or the memory plane, can perform an XOR operation regarding a preset number of data to generate parity information. That is, the control circuit 436 might perform both the operations of the control circuit 434 and the second parity operator 424 described with reference to FIG. 15. In addition, the page buffer 322A can include a plurality of latches 432 that can temporarily store data transferred during data input/output operations (e.g., read, program, erase operations), as well as an additional latch 438 capable of temporarily storing parity information. The parity information generated by the control circuit 436 can be stored in a memory die or a memory plane including the control circuit 436.

Compared to the embodiment of FIG. 15 in which the controller 130 transmits parity information to the memory device 150, occupancy of channels might become lower because the control circuit 436 corresponding to the second parity calculator 424 is included in the memory die or memory plane. However, the control circuit 436 included in the memory die or the memory plane of the memory device 150 can further include an additional logic circuit to perform an operation instead of the second parity operation unit 424 and an additional latch 438 for temporarily storing the parity information.

Figure 17:
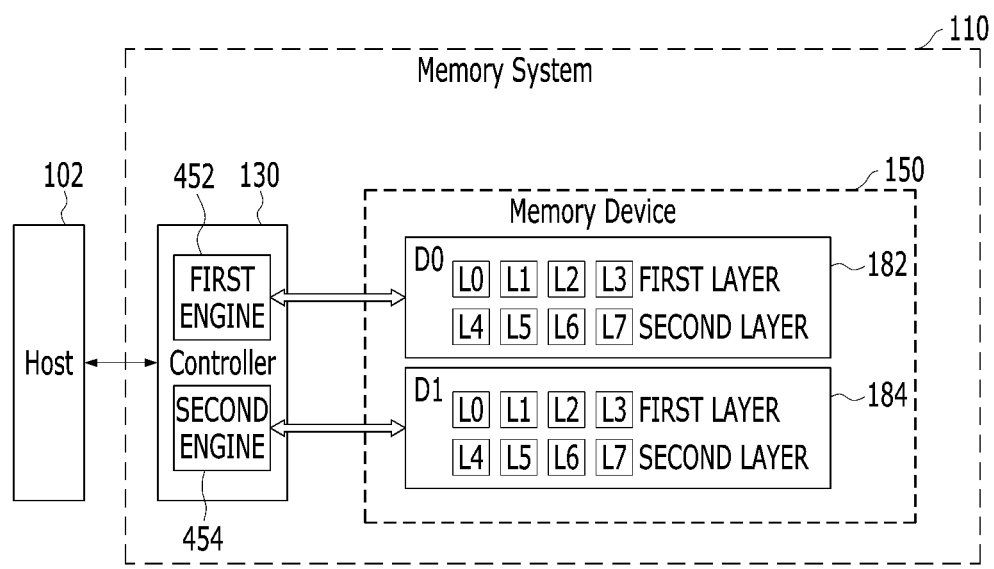
FIG. 17 illustrates a third example of the apparatus for controlling a data program operation according to an embodiment of the present disclosure.

FIG. 17 illustrates a third example of the apparatus for controlling a data program operation in accordance with an embodiment of the present disclosure.

Referring to FIG. 17, the memory system 110 receiving a data input/output command from the host 102 can include a controller 130 and a memory device 150. The memory device 150 may include a plurality of memory dies 182, 184 connected through different channels.

Each of the plurality of memory dies 182, 184 can include a plurality of layers. The first layer of the first memory die 182 can include four cell regions L0, L1, L2, L3, and the second layer can include four different cell regions L4, L5, L6, L7. According to an embodiment, the first memory die 184 can have three or more layers, and a plurality of cell regions can be disposed on every layer.

The controller 130 can include a first engine 452 corresponding to the first memory die 182 and a second engine 454 corresponding to the second memory die 184. The first engine 452 and the second engine 454 in the controller 130 can generate at least one piece of parity information by performing an exclusive-OR (XOR) operation on a preset number of LSB data during a data program operation. The first memory die 182 can include eight cell regions L0 to L7. According to an embodiment, the first engine 452 can generate one piece of parity information for four LSB data as described with reference to FIG. 12, The four LSB data and one parity information can be distributed over and programmed in 5 cell regions among the eight cell regions L0 to L7.

According to an embodiment, the first engine 452 can generate two pieces of parity information for four pieces of LSB data. In this case, four LSB data and two pieces of parity information may be distributed over and programmed in six cell regions among the eight cell regions L0 to L7. In this embodiment, even if errors occur in two cell regions among the eight cell regions L0 to L7, the first engine 452 in the controller 130 can recover or restore errored data based on information read from the other four cell regions.

The first engine 452 and the second engine 454 in the controller 130 can be arranged to correspond to, or be included in, the first memory die 182 and the second memory die 184. In this case, the first engine 452 and the second engine 454 can be included in the memory interface 142 described with reference to FIGS. 2 to 3. If the controller 130 includes a plurality of engines, operations for generating parity information for LSB data can be performed in parallel during a data program operation. When operations for generating and transferring parity information can correspond to a channel, overheads could be reduced.

Figure 18:
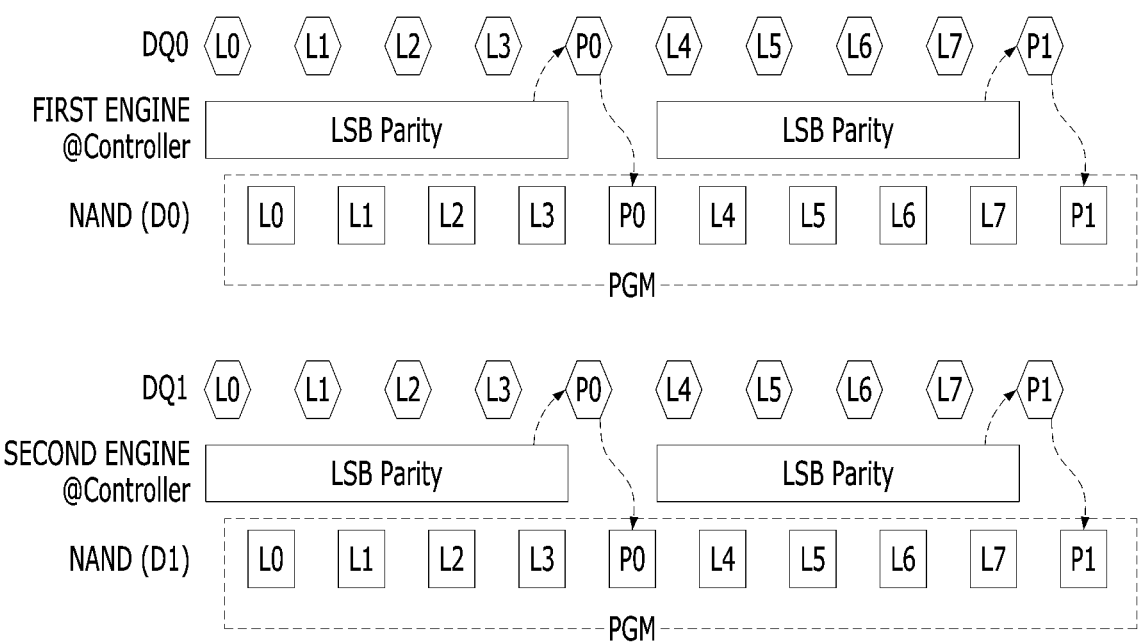
FIG. 18 illustrates operations performed by the apparatus shown in FIG. 17 according to an embodiment of the present disclosure.

FIG. 18 illustrates operations performed by the apparatus shown in FIG. 17 in accordance with an embodiment of the present disclosure. FIG. 18 shows a data transfer operation between the controller 130 and either the first memory die 182 or the second memory die 184 in the memory device 150 described with reference to FIG. 17 and a program operation performed within the first memory die 182 and the second memory die 184.

Referring to FIG. 18, the controller 130 may transmit the first LSB data L0 to the first memory die D0 through the first channel DQ0. The first engine in the controller 130 can start a parity operation (LSB Parity) for the first LSB data L0. After the first LSB data L0 is successfully completed in the first memory die D0, the controller 130 can transfer the second LSB data L1 to the first memory die D0. The first engine in the controller 130 can perform a parity operation (LSB Parity) on the first LSB data L0, which is the result of the previous parity operation, and the second LSB data L1. The controller 130 can sequentially transfer the third LSB data L2 and the fourth LSB data L3 to the first memory die D0, and the first memory die D0 can program the third LSB data L2 and the fourth LSB data L3 sequentially. The first engine in the controller 130 can transfer the fourth LSB data L3 to the first memory die D0, and then performs a parity operation (LSB Parity) on the first to fourth LSB data to generate the first parity information P0 corresponding to the first to fourth LSB data L0, L1, L2, L3. The controller 130 can transfer the first parity information P0 to the first memory die 182, and then the first memory die 182 can program the first parity information P0 therein.

The controller 130 can sequentially transfer the first to fourth LSB data L0, L1, L2, L3 and the first parity information P0 to the first memory die D0 through the first channel DQ0. In parallel with the second channel DQ0, the controller 130 can transfer other first to fourth LSB data L0, L1, L2, L3 and the first parity information P0 to the second memory die D1. Referring to FIG. 18, overheads occurring in a process for generating and backing up parity information to increase data safety during a data program operation could be greatly reduced. For example, by transmitting and programming one piece of parity information for every four LSB data, an overhead of about 25% might occur based on a program operation margin for the LSB data.

The controller 130 can generate parity information for the other four LSB data L4, L5, L6, L7 in a similar manner, and sequentially transfer the four LSB data L4, L5, L6, L7 and the parity information P1 through a channel. The memory die D0 may sequentially program the four LSB data L4, L5, L6, L7 and the parity information P1 which are transferred from the controller 130.

Figure 19:
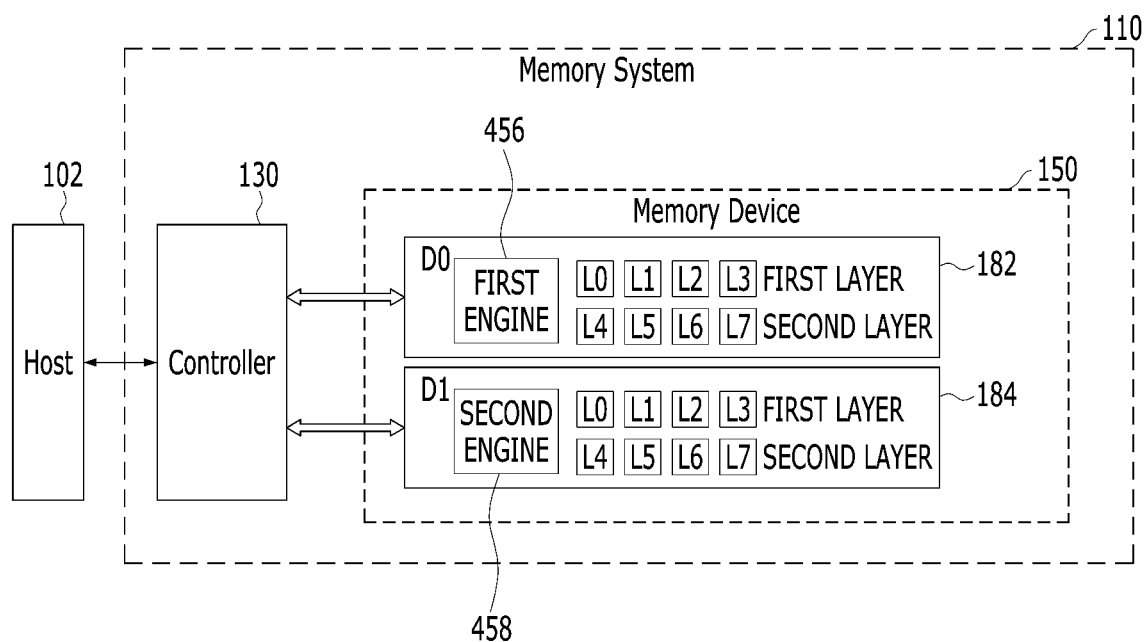
FIG. 19 illustrates a fourth example of the apparatus for controlling a data program operation according to an embodiment of the present disclosure.

FIG. 19 illustrates a fourth example of the apparatus for controlling a data program operation in accordance with an embodiment of the present disclosure.

Referring to FIG. 19, the memory system 110 receiving a data input/output command from the host 102 can include a controller 130 and a memory device 150. The memory device 150 can include a plurality of memory dies 182, 184 connected through different channels.

Each of the plurality of memory dies 182, 184 can include a plurality of layers. The first layer of the first memory die 182 can include four cell regions L0, L1, L2, L3, and the second layer can include four different cell regions L4, L5, L6, L7. According to an embodiment, the first memory die 184 can have three or more layers, and a plurality of cell regions can be disposed on a single layer.

The first memory die 182 can include a first engine 452, while the second memory die 184 can include a second engine 454. The first engine 452 and the second engine 454 can generate at least one piece of parity information by performing an exclusive-OR (XOR) operation on a preset number of LSB data during a data program operation. The first memory die 182 can include eight cell regions L0 to L7. According to an embodiment, the first engine 452 may generate one piece of parity information for four LSB data as described with reference to FIG. 12, and the four LSB data and one parity information can be distributed and programmed in 5 cell regions among the eight cell regions L0 to L7.

According to an embodiment, the first engine 452 can generate two pieces of parity information for four pieces of LSB data. In this case, four pieces of LSB data and two pieces of parity information can be distributed over, and programmed in, six cell regions among the eight cell areas L0 to L7. In this case, even if a problem occurs in two cell regions among the eight cell regions L0 to L7, the first engine 452 in the controller 130 can restore or recover data based on information read from the other four cell regions.

The first engine 452 and the second engine 454 can be included in the first memory die 182 and the second memory die 184, individually. The first memory die 182 and the second memory die 184 can generate parity information through the first engine 452 and the second engine 454 included therein, and the parity information can be stored in a cell region thereof. The controller 130 might not be involved in parity information generation and the parity information backup during the data program operation, so that the controller 130 can perform or schedule another data input/output operation requested by the host 102. Further, because parity information can be generated and programmed inside the first memory die 182 and the second memory die 184 without transmission through a channel, an error that could occur during transmission and reception of parity information through the channel can be avoided.

Figure 20:
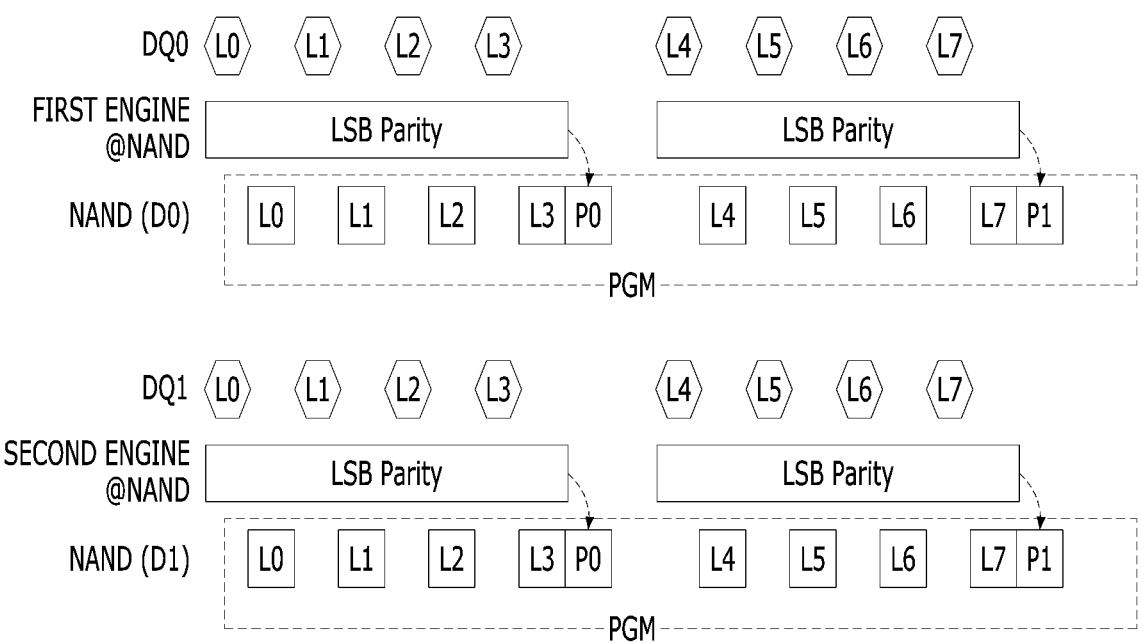
FIG. 20 illustrates a first example of operations performed by the apparatus shown in FIG. 19 according to an embodiment of the present disclosure.

FIG. 20 illustrates a first example of operations performed by the apparatus shown in FIG. 19 in accordance with an embodiment of the present disclosure.

Referring to FIG. 20, when an engine that generates parity information during a program operation is included in a memory die, the controller 130 stores four pieces of LSB data L0, L1, L2, L3 in the first memory die D0. The first engine included in the first memory die D0 can perform a parity operation (LSB Parity) while programming the LSB data L0, L1, L2, L3 transferred via the channel in the cell regions. After the last data (L3) among the four pieces of LSB data L0, L1, L2, L3 is programmed in a cell region, the parity information P0 corresponding to the four pieces of LSB data L0, L1, L2, L3 can be programmed in a region.

Because each of the first memory die 182 and the second memory die 184 can include an engine capable of generating parity information, individually, operations for generating and backing up parity information P0 along with the program of LSB data transmitted through the channel can also be performed in parallel. Transmission and reception for the parity information P0 might not be required between the controller 130 and the first memory die 182 or the second memory die 184 through the channel, so that channel occupancy can be reduced. An operating margin for transmission/reception of the parity information P0 could be avoided.

Figure 21:
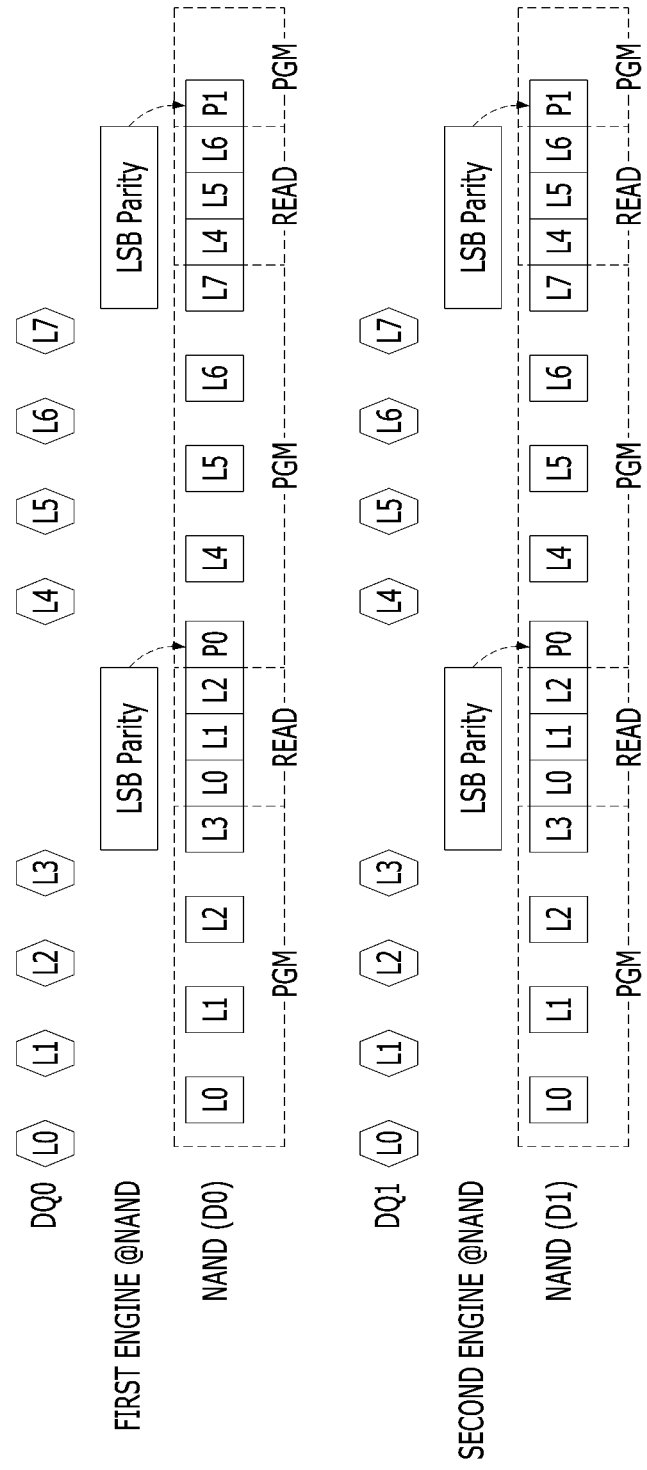
FIG. 21 illustrates a second example of operations performed by the apparatus shown in FIG. 19 according to an embodiment of the present disclosure.

FIG. 21 illustrates a second example of operations performed by the apparatus shown in FIG. 19 in accordance with an embodiment of the present disclosure. The parity generation and backup operations described in FIG. 21 may be performed similarly to the operations described in FIG. 13.

Referring to FIG. 20, when an engine that generates parity information during a program operation is included in the memory die, the controller 130 can transfer four pieces of LSB data L0, L1, L2, L3 to the first memory die D0 sequentially. The first memory die D0 can sequentially program the four pieces of LSB data L0, L1, L2, L3 received through the channel in the cell region. After the last LSB data L3 is programmed, the engine included in the first memory die D0 can finish a parity operation (LSB Parity) for the four pieces of LSB data L0, L1, L2, L3. For example, an exclusive OR (XOR) operation can include sequentially reading the previously stored three pieces of LSB data L0, L1, L2. After parity information P0 corresponding to the four pieces of LSB data L0, L1, L2, L3 has been calculated (LSB Parity), the parity information P0 can also be programmed in a cell region.

Because the first memory die 182 and the second memory die 184 individually includes an engine capable of generating parity information, generating and backing up the parity information P0 can be performed in parallel along with programming LSB data transmitted through the channel. Since there is no transmission/reception of the parity information P0 between the controller 130 and the first memory die 182 or the second memory die 184 through the channel, channel occupancy could be reduced. In addition, as described in FIG. 13, when a structure of the page buffer and cache buffer is used, generation and backup of parity information can be performed without adding a separate latch configured to generate parity information in the first memory die 182.

Figure 22:
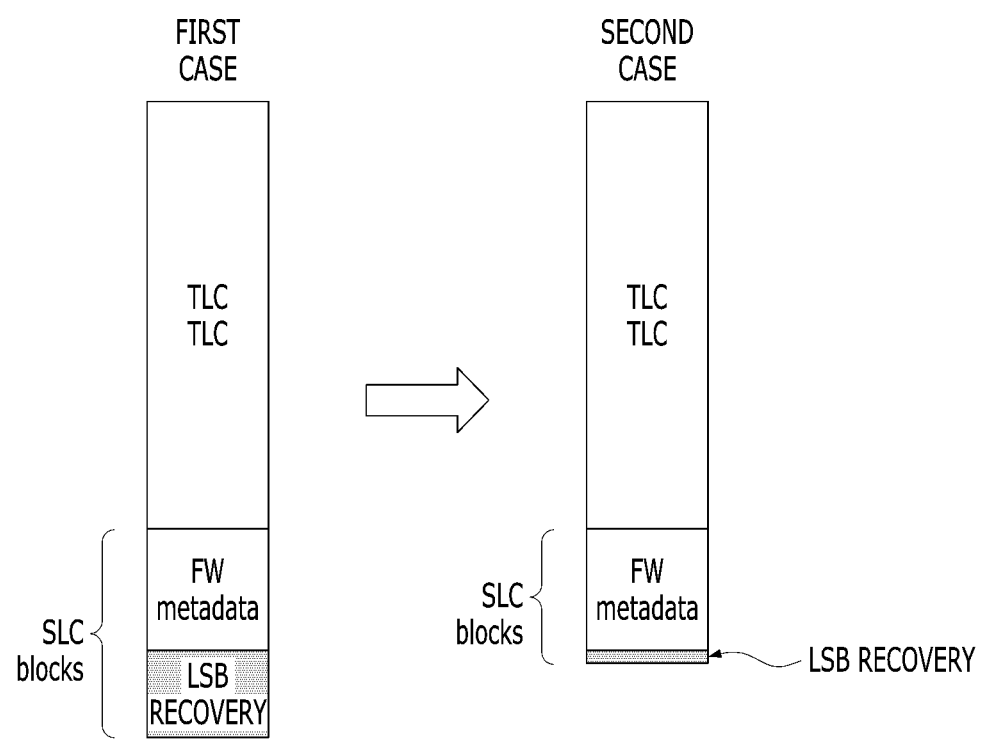
FIG. 22 illustrates an effect of an embodiment of the present disclosure.

FIG. 22 illustrates an effect of an embodiment of the present disclosure.

Referring to FIG. 22, effects of the memory system 110 and the memory device 150 according to various embodiments of the present disclosure can be understood. While the multi-bit data is programmed in a non-volatile memory cell of the memory device 150 through a multi-step programming operation, it is necessary to back up the LSB data to ensure data safety or reliability. When the LSB data is backed up as it is, a size of a region allocated for the LSB backup in the SLC buffer of the memory device 150 can increase. In addition, if the space allocable in the SLC buffer is insufficient, an operation of programming multi-bit data in the memory device 150 might be delayed, so that data input/output performance might deteriorate.

In various embodiments of the present disclosure to back up LSB data or secure data safety or reliability, the memory system 110 or the memory device 150 can generate and back up parity information corresponding to the LSB data. In this case, the program operation may be performed in one of plural ways: backing up the LSB data, generating and backing up a parity for the LSB data, and not generating a parity for the LSB data (e.g., see FIG. 10). As described above, a space allocated in the SLC buffer for the program operation in the memory device 150 could be reduced to determine a backup range based on an attribute of the multi-bit data including the LSB data programmed in the memory device 150. Resources in the memory system 110 or the memory device 150 can be used more efficiently, thereby improving data input/output performance and durability of the memory device.

As described above, a memory system according to an embodiment of the present disclosure can reduce overheads and resources spent on generating parity information used to restore or recover data in a data program operation or a procedure of programming multi-bit data in a memory device.

Further, in the memory system according to an embodiment of the present disclosure, an apparatus capable of recovering data from abnormal interruption of a data program operation may be selectively included in the controller or the memory device, thereby increasing design flexibility for the memory system.

In addition, a memory system according to an embodiment of the present disclosure can improve operational safety of a data program operation without increasing a size (or storage capability) of a data buffer including non-volatile memory cells, thereby increasing a size (or storage capability) for storing data in a memory device.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, control circuitry, devices, modules, units, multiplexers, generators, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, control circuitry, devices, modules, units, multiplexers, generators, logic, interfaces, decoders, drivers, generators and other signal generating and signal processing features may be, for example, any of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, processors, control circuitry, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A memory device, comprising:
    a first memory group including plural first non-volatile memory cells storing multi-bit data;
    a second memory group including plural second non-volatile memory cells storing single-bit data; and
    a program operation controller configured to:
    build the multi-bit data based on data inputted from an external device,
    perform a logical operation regarding partial data among the multi-bit data to generate a parity,
    program the parity in the second memory group after programming the partial data in the first memory group,
    perform a verification operation regarding the partial data after a sudden power-off (SPO) occurs,
    recover the partial data based on the parity and a result of the verification operation, and program the recovered partial data in the first memory group.

2. The memory device according to claim 1, wherein the program operation controller is further configured to output a completion notice associated with the programming of the partial data after the partial data has been successively programmed in the first memory group.

3. The memory device according to claim 2, wherein the program operation controller programs the parity in the second memory group after the outputting of the completion notice.

4. The memory device according to claim 2,
wherein the partial data is least significant bit (LSB) data among the multi-bit data, and
wherein the logical operation includes an exclusive OR (XOR) operation performed while the program operation controller programs the multi-bit data into the first memory group through a multi-step program operation corresponding to a number of bits of the multi-bit data.

5. The memory device according to claim 2,
wherein the program operation controller is further configured to program the multi-bit data into the first memory group through a binary program operation and a foggy-fine program operation, and
wherein the partial data includes data programmed in the binary program operation.

6. The memory device according to claim 1, wherein the program operation controller recovers the partial data based on programmed values, which correspond to the partial data in the first memory group and the parity in the second memory group, during the verification operation performed after power is resumed.

7. The memory device according to claim 6, wherein the program operation includes an operation for determining whether the multi-bit data has been successively programmed based on a result of a verification operation after the recovered partial data is programmed in the first memory group.

8. The memory device according to claim 1, wherein the program operation controller is further configured to determine a backup range based on an attribute of the multi-bit data, before the performing of the logical operation.

9. The memory device according to claim 8, wherein the program operation controller is further configured to:
perform a recovery operation for an error in the partial data stored in the first memory group, and
back up the partial data among the multi-bit data in the second memory group during the recovery operation.

10. The memory device according to claim 1, wherein the first memory group and the second memory group are included in different memory blocks of a single memory die.

11. The memory device according to claim 10, wherein the program operation controller is included in the memory die.

12. The memory device according to claim 1, wherein the program operation controller is coupled via a data channel to a memory die including the first memory group and the second memory group.

13. The memory device according to claim 1, further comprising:
a cache buffer temporarily storing the partial data; and
plural page buffers coupled to the first memory group and the second memory group to store the partial data transferred from the cache buffer.

14. The memory device according to claim 13, wherein the program operation controller includes a parity generation engine configured to generate the parity based on the partial data transferred from the cache buffer to the plural page buffers.

15. A memory system, comprising:
at least one memory die including:
a first memory group including plural first non-volatile memory cells storing multi-bit data; and
a second memory group including plural second non-volatile memory cells storing single-bit data; and
at least one program operation controller configured to:
build the multi-bit data based on write data inputted from an external device,
perform a logical operation regarding partial data among the multi-bit data to generate a parity,
program the parity in the second memory group after programming the partial data in the first memory group,
perform a verification operation regarding the partial data after a sudden power-off (SPO) occurs,
recover the partial data based on the parity and a result of the verification operation, and
program recovered partial data in the first memory group.

16. The memory system according to claim 15, further comprising a controller coupled via a data channel to the at least one memory die and configured to receive the write data from the external device and determine a location for storing the multi-bit data in the first memory group.

17. The memory system according to claim 16, wherein the controller is further configured to determine a backup range based on an attribute of the multi-bit data.

18. The memory system according to claim 17, wherein the at least one program operation controller is included in the controller.

19. The memory system according to claim 18, wherein the at least one program operation controller is further configured to:
perform a recovery operation for an error in the partial data stored in the first memory group, and
back up the partial data among the multi-bit data in the second memory group during the recovery operation.

20. The memory system according to claim 15, wherein the at least one program operation controller is included in the at least one memory die.

* * * * *